United States Patent [19]

Marchetto et al.

[11] Patent Number: 5,418,818
[45] Date of Patent: May 23, 1995

[54] DIGITAL SIGNAL PROCESSOR EXCITER

[75] Inventors: Robert F. Marchetto, Burnaby; Todd A. Stewart, West Vancouver; Paul A. Goud, Vancouver, all of Canada; David W. Kroeger; Charles B. Cox, both of Quincy, Ill.; Timothy J. Linderer, Payson, Ill.; Richard J. Hinkle, Taylor, Mo.; Robert J. Shade, Quincy, Ill.

[73] Assignee: Glenayre Electronics, Inc., Charlotte, N.C.

[21] Appl. No.: 950,241

[22] Filed: Sep. 22, 1992

[51] Int. Cl.⁶ ............... H04L 25/00; H04L 27/00; H04L 23/02; H04L 5/12
[52] U.S. Cl. ............... 375/264; 455/51.2; 455/92; 455/102; 455/118; 375/216; 375/224; 375/356
[58] Field of Search ............ 375/5, 39, 59, 69, 106, 375/62, 107; 455/51.2, 92, 102, 112, 118, 151.1, 154.1, 22; 332/103, 117

[56] References Cited

U.S. PATENT DOCUMENTS

| | | | |
|---|---|---|---|
| 4,255,814 | 3/1981 | Osborn | 455/51.2 |
| 4,262,361 | 4/1981 | Hauer | 455/118 |
| 4,381,546 | 4/1983 | Armstrong | 455/67 |
| 4,570,265 | 2/1986 | Thro | 455/102 |
| 4,606,049 | 8/1986 | Daniel | 375/45 |
| 4,617,537 | 10/1986 | Nossek | 332/48 |
| 4,672,633 | 6/1987 | Claasen et al. | 375/39 |
| 4,748,685 | 5/1988 | Rozanski, Jr. | 455/218 |
| 4,807,257 | 2/1989 | Schouhamer Immink et al. | 375/106 |
| 4,835,792 | 5/1989 | Davarian | 375/80 |
| 4,843,613 | 7/1989 | Crowle | 375/59 |
| 5,003,617 | 3/1991 | Epsom et al. | 455/51 |
| 5,046,128 | 9/1991 | Bennett | 455/51 |
| 5,105,439 | 4/1992 | Bennett et al. | 455/51.2 |
| 5,163,159 | 11/1992 | Rich et al. | 375/5 |
| 5,200,978 | 4/1993 | Lo Curto et al. | 375/59 |
| 5,241,562 | 8/1993 | Partyka et al. | 375/1 |

OTHER PUBLICATIONS

"Indirect FM"—Simon Haykin—An Introduction to Analog and Digital Communications—1989 John Wiley & Sons Inc, pp. 339–344.

Primary Examiner—Stephen Chin
Assistant Examiner—Amanda T. Le
Attorney, Agent, or Firm—Christensen, O'Connor, Johnson & Kindness

[57] ABSTRACT

A digital exciter (30) for selectively modulating digital or analog input data. The digital exciter includes a digital signal modulator (32) and a digital quadrature modulator (DQM)(36) comprising two digital signal processors (DSPs). The signal modulator is controlled by a control (40). An operator can selectively determine whether the digital exciter is used for modulating either two level or four level NRZ digital data and whether the device is to provide linear modulation or frequency modulation (FM) of the input signal. An interpolator (38) interpolates a 66⅔ kHz timer interrupt rate used in the signal modulator to a 400 kHz rate, thereby reducing the processing load on the DSP comprising the DQM by simplifying the sine and cosine values used in the quadrature modulation. An operator can select from among a plurality of operating parameters on a menu for controlling the signal modulator, either from a local or a remote video display terminal (VDT).

43 Claims, 27 Drawing Sheets

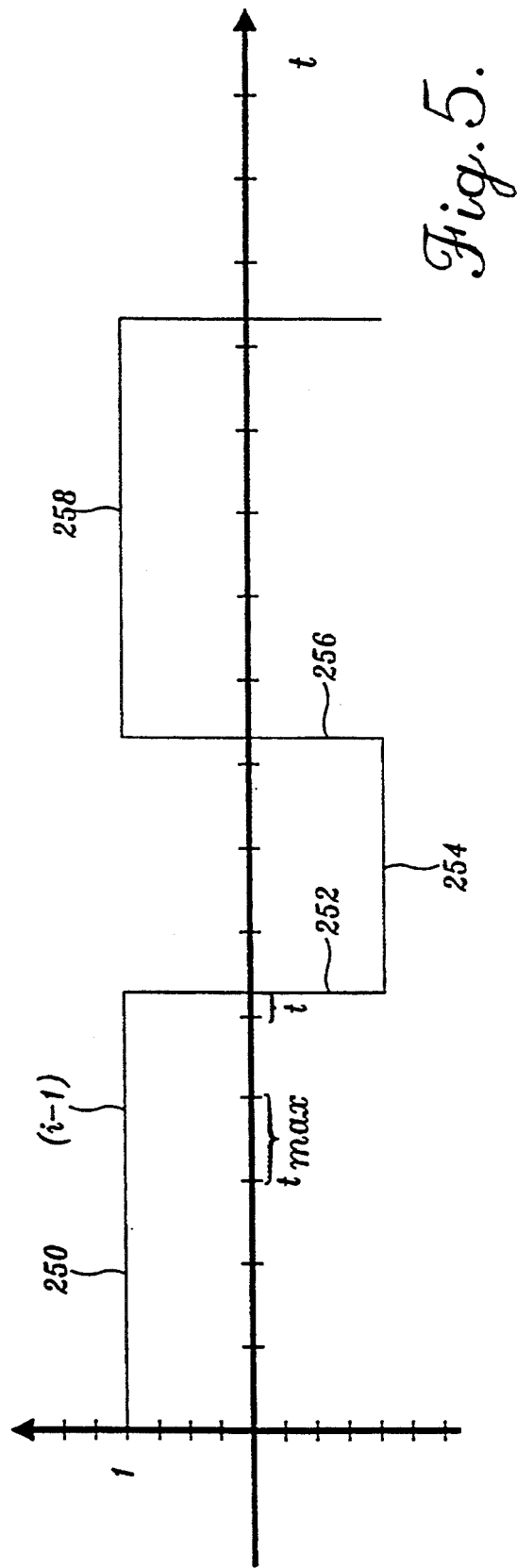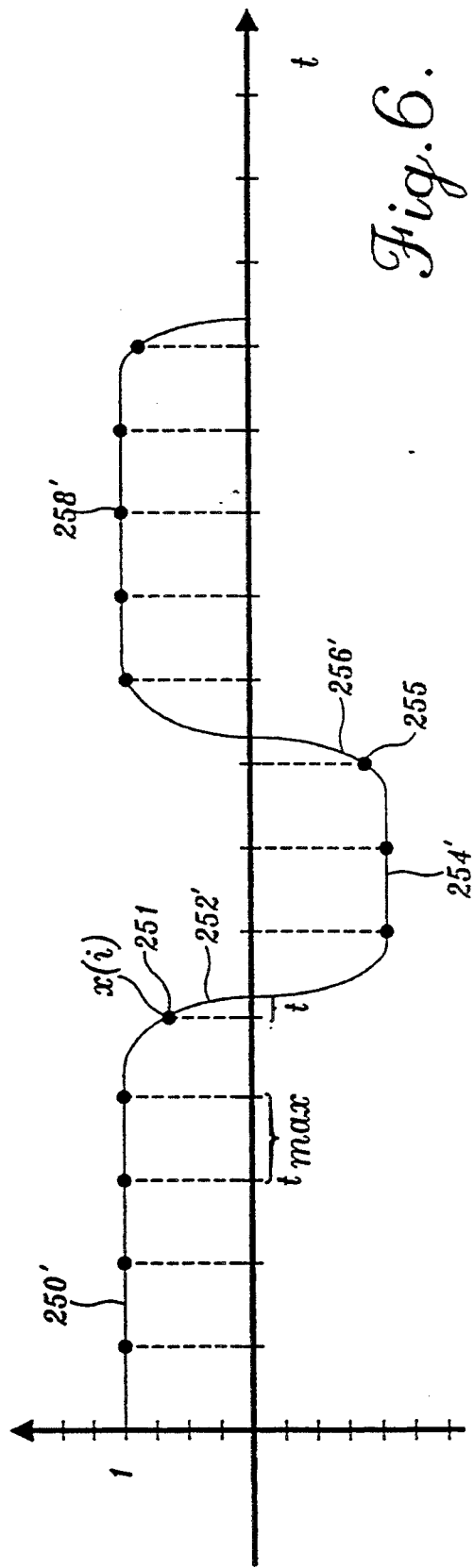

DIGITAL SIGNAL PROCESSOR EXCITER

FIELD OF THE INVENTION

This invention generally relates to a radio frequency (RF) signal modulator circuit, and more specifically, to a digital exciter used in a transmitter for modulating analog or data signals for transmission in different selected formats.

BACKGROUND OF THE INVENTION

Simulcast paging systems convey data or voice signals from a central terminal to a plurality of paging transmission sites, which then modulate the data for transmission to pager receivers carried by subscribers to the service. The paging transmission sites thus each include an exciter that modulates an input signal and produces an output signal in a desired modulation format for amplification and transmission over a paging zone. The specific type of modulation used depends upon the requirements of the simulcast system and may include standard frequency modulation (FM), frequency shift keying (FSK), four level FSK, variants of π/4 quadrature phase shift keying (QPSK), variants of quadrature amplitude modulation (QAM), variants of amplitude companded single side band (ACSSB), and digital voice compression. The modulation scheme may also have to meet the requirements of the relatively new standard for high-speed paging systems in Europe (ERMES). In addition, the modulator must be sufficiently versatile to operate with different types of input signals, including analog voice and paging data at rates up to, and possibly in excess of 2400 baud, and with an input signal that may contain DC levels. Although different hardware modulators can be designed to handle each of the various input signal and modulation formats, it would clearly be more cost effective to provide a digital modulator that can readily be changed by modifying the software that controls its operation, to handle any of these requirements.

The advantages of a paging system modulator based upon a digital signal processor (DSP) have already been recognized in the art. Such a device is described in a paper entitled "4-PAM/FM Modulator with DSP: A Solution for ERMES," by Jaime Bustillo, Miquel Rodriguesz-Palanca, and Javier Perez, presented at the May 1991 Vehicular Technology Conference. The paper notes that the frequency specifications of the proposed ERMES standard are difficult to meet, particularly, the specification for a center frequency stability of ±15 Hz and a difference between any two adjacent symbol frequencies of 3,125±15 Hz. However, use of the DSP for a signal modulator, as disclosed in the paper, enables these requirements to be met. The disclosed DSP implements data preprocessing, includes an integrator, and uses a transition table to store the possible transitions between four possible different data symbols (four level FSK). The data are convened to complex values by multiplying with sine and cosine values stored in lookup tables. The resulting products are then converted from digital-to-analog (D-A) format and respectively multiplied by quadrature RF signals in an analog quadrature modulator before being added together for transmission as an RF output signal.

The solution to the problem disclosed in the above referenced paper is only a partial one. The approach used in this prior art DSP tends to use excessive power and requires a relatively expensive high-speed D-A converter, since the typical RF frequency of the output signal is usually in the tens of MHz range. Since the disclosed prior art DSP modulator discussed above is designed to modulate only a digital signal, the paper describing it does not include any component to eliminate spurious noise artifacts that result from sampling an analog signal at a different and usually lower rate than that at which a quadrature modulator operates. Modulation of the input signal (prior to its quadrature modulation) should include some means for carrier frequency adjustment, deviation limiting and adjustment, and intermediate frequency (IF) filtering—none of which are disclosed in the above referenced paper.

Use of a sine and cosine lookup table to produce a complex signal conversion in the modulator typically produces excessive spurious noise unless sufficient resolution is provided in the table. However, to reduce the spurious noise to the desired −90 dB level would require a lookup table of about 64 Kbytes in length—generally much larger than desirable in a low-cost modulator.

If the input signal to the modulator comprises a data signal that is asynchronously sampled at a relatively low rate of, for example, 19,200 Hz rate by a DSP modulator, there is a significant jitter problem, because the transitions between logic levels of the data signal occur asynchronously at points in time that may differ from the times at which the samples occur. In most instances, a maximum jitter rate of ±1 μs is desired, but to obtain this precision in the sampled signal would require an unacceptable increase in the sample/processing rate.

Conventional modulators provide analog adjustments to control characteristic parameters of the modulation scheme employed, including parameters such as the deviation frequency for frequency shift key modulation, the center frequency of the modulation, an analog deviation limit, an analog frequency deviation level, and an FSK frequency deviation level. These adjustments are typically carried out by "tweaking" a variable potentiometer, variable inductor, variable capacitor, or other analog device, while monitoring the effect of the adjustment by measurements made on test points in the circuit with specialized test equipment. Occasionally, setting the adjustment may require checking the modulated RF signal picked up on a receiver. These adjustments are susceptible to imprecision in setting a parameter, and the values to which the parameters are adjusted are likely to drift over time due to aging of components or due to changes in ambient conditions, such as temperature. After adjustment of some of the parameters, it may be necessary to allow the modulator to stabilize for 20–30 minutes before the effect of an adjustment is correctly determined. Even a prior art digital signal modulator, such as that disclosed in the Bustillo et al. paper noted above, does not apparently include any provision for digitally defining these parameters or for controlling the modulation of an RF signal using digital values for the parameters that are input by an operator. Clearly, such a feature would provide a significant advantage in setting up a modulator used in a paging system or for other purposes. It would also be beneficial to be able to set these parameters from a remote location, enabling a technician, for example, to remotely adjust the offset in the center frequency to different values for modulators in each of the simulcast transmitters having overlapping zones.

If the digital adjustment and control of the modulator provides a desirable advantage, a related improvement over current technology would be the provision for displaying the values of certain operating conditions in the modulator in digital format. For instance, signals such as a modulation detection signal (indicating that an input signal is being provided and that a modulated signal is being produced), a frequency deviation signal for FSK modulation, an analog frequency level signal, and a center frequency offset signal should be available to an operator, both at the site of the modulator and from a remote location to enable monitoring the operation of the modulation process. The prior art does not provide any such capability integral to the modulator; instead, additional instrumentation must be provided to monitor these conditions.

The above discussion identifies several problems that should be resolved to provide a more versatile digital modulator that is programmable, so that it can be used to modulate different kinds of input signals to produce selected output signal formats. The advantages and features of the present invention, with regard to the above-noted problems, will be apparent from the attached drawings and the Detailed Description of the Preferred Embodiments that follows.

SUMMARY OF THE INVENTION

In accordance with the present invention, an exciter for a radio transmitter is defined that includes means for supplying an input signal to the exciter for processing and transmission as a radio signal. Input signal modulator means, coupled to the means for supplying the input signal, modulate the input signal and produce a modulated signal that is complex, having both in-phase and quadrature components. Interpolator means, coupled to the input signal modulator means to receive the modulated signal, sample the modulated signal to produce sampled values and interpolate between the sampled values of the modulated signal to determine interpolated values intermediate the sampled values, thereby substantially increasing an effective sample rate at which the modulated signal is sampled. The sampled and interpolated values together comprise an interpolated signal. Quadrature modulator means, coupled to the interpolator means to receive the interpolated signal, convert the interpolated signal from a complex signal to a pass band signal that is not complex. Up converter means, coupled to the quadrature modulator means to receive the pass band signal, convert the pass band signal to a first intermediate frequency signal, and then to a second intermediate frequency signal for output and transmission as the radio signal. The second intermediate frequency is substantially higher than the first intermediate frequency.

The up converter means comprise a D-A converter that receives the pass band signal and converts it from a digital signal to an analog signal. A first local oscillator in the up converter produces a first periodically varying signal having a frequency substantially higher than that of the pass band signal. Also included in the up converter means is a first multiplier that multiplies the first periodically varying signal by the analog signal to produce the first intermediate frequency signal and a band pass filter that filters the first intermediate frequency signal to produce a filtered signal. A second local oscillator produces a second periodically varying signal having a frequency substantially higher than that of the filtered signal, and a second multiplier multiplies the second periodically varying signal by the filtered signal to produce the second intermediate frequency signal, which comprises the output signal.

In the preferred form of the invention, the interpolator means and the quadrature modulator means comprise a second digital processor. The input signal modulator means preferably include a low pass filter coupled to receive and filter the input signal, and a voltage controlled oscillator that comprises a first digital signal processor, the first digital signal processor producing the in-phase and quadrature components by taking the sine and cosine of the phase signal, which corresponds to the input signal. The digital signal processor includes memory in which a lookup table of a limited number of values for the periodic functions are stored. Values for the periodic functions intermediate those that are stored in the lookup table are interpolated with a second order interpolator to improve the resolution with which the values of the periodic functions used to determine the quadrature and in-phase components are defined.

The means for supplying the input signal comprise an edge detector that produces an edge detect signal when a data input signal changes logical state, and the input signal modulator means include a timer responsive to the edge detect signal. Further, the timer determines a time interval between when the input signal was last sampled at a predefined sample rate and the time at which the edge detect signal is produced, said input signal modulator means including filter means to interpolate between samples of the input signal based on the time interval to determine filtered signal state changes that are synchronous with changes in the logical state of the data input signal. In the preferred form of the exciter, the filter means comprise a finite impulse response low pass filter. The input signal modulator means comprise frequency shifter means for adjusting a center frequency of the complex signal by a variable increment. In addition, the input signal modulator means preferably include modulation selector means that enable an operator to select one of a linear modulation and a frequency modulation of the input signal. The linear modulation can be of a variety of variants, e.g., 4 QAM and 16 QAM.

In another aspect of the present invention, apparatus are defined for selectively setting and adjusting at least one characteristic parameter for modulating an RF signal produced by the exciter without the need for monitoring the RF signal to determine the effect of such adjustment. The one or more parameters are selected from a group that includes: a frequency deviation limit for a frequency shift keying modulation, an exciter center frequency, an analog frequency deviation limit, an analog frequency deviation level, a frequency shift keying frequency deviation level, an analog signal modulation delay, and a digital signal modulation delay. The apparatus includes input signal sampling means, coupled to receive an input signal, for sampling the input signal, producing a plurality of sampled values corresponding to the input signal. Digital signal processor means, coupled to receive the sampled values, produce a complex modulated signal in which the sampled values determine a modulated condition according to a selected modulation scheme. Processor control means, coupled to the digital signal processor means, control the digital signal processor means according to a set of predefined program instructions. The processor control means use an operator selected digital value for the one or more characteristic parameters to control the digital signal processor means. Operator interface means, coupled to the processor control means, accept an operator selection of the digital value for the one or more characteristic parameters. The processor control means thereby supply the digital signal processor means with the digital value for use in producing the complex modulated signal and thus substantially eliminate drift or variation in the one or more characteristic parameters with time and as a function of changes in ambient conditions that might otherwise result from an analog adjustment of the one or more characteristic parameters.

The operator interface means can comprise a remote terminal that is coupled to the processor control means from a different geographical location than that where the processor control means are disposed. Further, the operator interface means comprise a key panel and a display, the key panel including a plurality of discrete switches selectively actuated by the operator to select the digital value for the one or more characteristic parameters.

The processor control means monitor the modulation condition, producing a signal indicative of the modulation condition, and the operator interface means display a value corresponding to the signal to an operator. This signal indicative of the modulation condition is preferably selected by the operator from a group of signals that includes: an input data detection signal, a modulation mode signal, a frequency deviation limit signal for FSK modulation, an analog peak frequency deviation signal, an analog frequency deviation level signal, an FSK frequency deviation level signal, an analog signal delay signal indicative of a delay applied to the modulation of an analog input signal, a digital delay signal indicative of a delay applied to the modulation of a digital signal, and a center frequency offset signal. The digital signal processor means include a selectable pre-emphasis filter, so that the processor control means respond to an operator input to cause the digital signal processor means to selectively use the pre-emphasis filter when producing the complex modulated signal.

A method for using an input signal to produce a modulated RF output signal for transmission, and a method for selectively setting and adjusting at least one characteristic parameter used by an exciter in a radio transmitter are further aspects of the present invention. These methods respectively include steps generally consistent with the functions of the exciter and of the apparatus described above.

BRIEF DESCRIPTION OF THE DRAWINGS

FIGS. 5 is a graph showing a short segment of a non-return to zero (NRZ) input data signal over time;

FIG. 6 is a graph showing sampled values for the filtered data signal of FIG. 5, interpolated at each rising and falling edge of the input signal;

DETAILED DESCRIPTION OF THE PREFERRED EMBODIMENT

Overview

Figure 1:
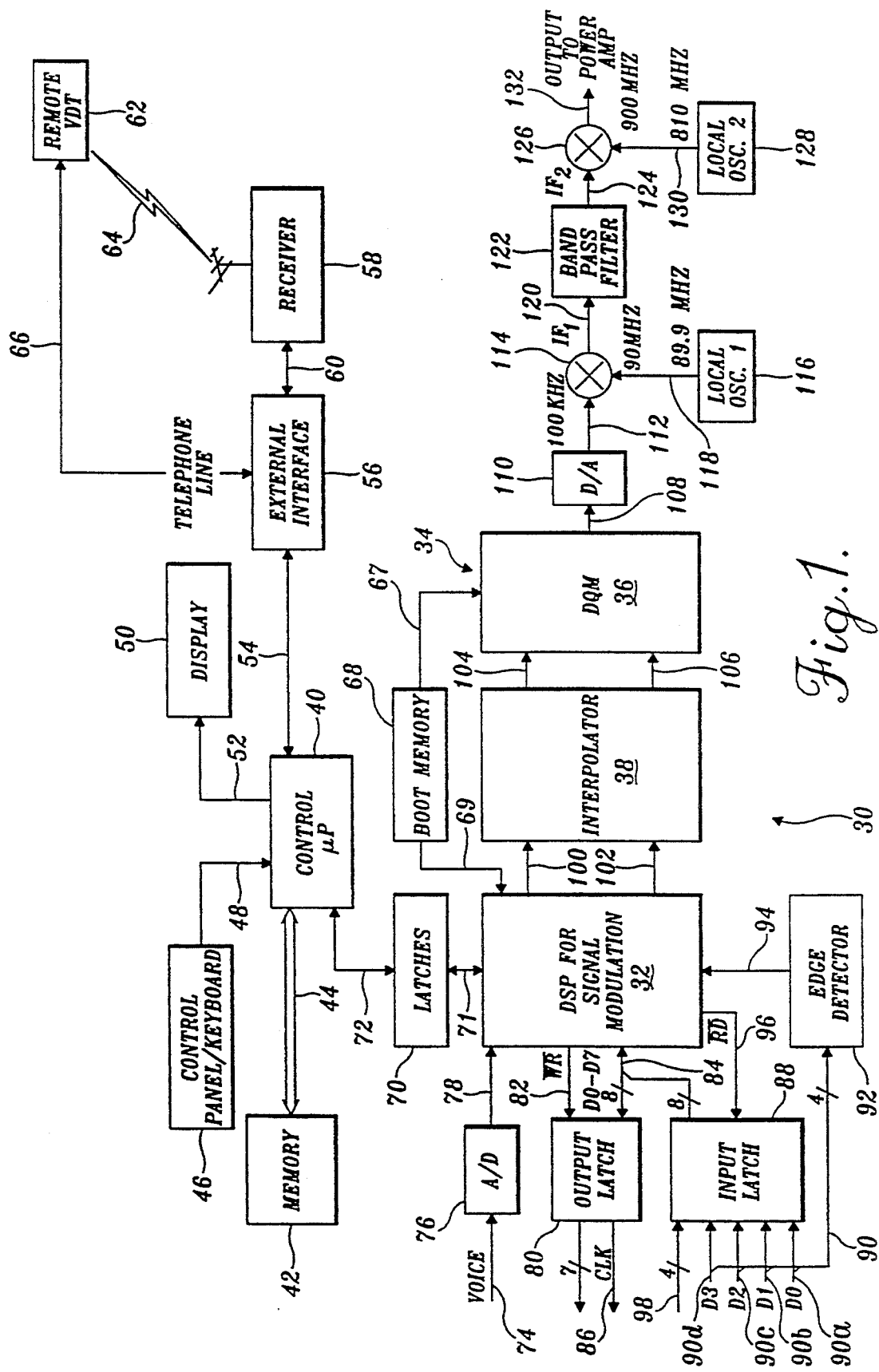
FIG. 1 is a functional block diagram of a digital exciter.

Referring to FIG. 1, a block diagram of a digital exciter 30 is shown that generally illustrates the functions implemented by the device. Digital exciter 30 principally comprises a signal modulator 32 and a digital quadrature modulator (DQM) 36. The signal modulator is designed to sample either a digital input signal comprising (NRZ) data, or an analog (voice) signal; it then processes the samples input to it and selectively produces either a complex base band frequency modulated (FM) signal, or alternatively, a linear modulated complex base band signal. Thus, one of the primary advantages of this digital exciter is its ability to be operated selectively as a linear modulator, capable for example, of QAM modulation of the input signal in a variety of different variants, including 4 QAM and 16 QAM. This facility of the digital exciter to selectively operate in different modes is achieved by using a digital signal processor (DSP) for the signal modulator. In the preferred embodiment, two DSPs (Analog Devices ™, type ADSP 2105), one for signal modulator 32 and the other carrying out the functions of DQM 36 and also of an interpolator 38, the purpose of which is discussed below. It should be apparent to those of ordinary skill in the art that a single DSP could be used to provide the functions of signal modulator 32, interpolator 38, and DQM 36 if a device having sufficient processing speed is available. However, for purposes of economy, the present preferred embodiment uses two of the devices and implements the functions of interpolator 38 on the same DSP as used for DQM 36.

Signal modulator 32 is controlled by a microprocessor control 40, which allows an operator to select the mode in which the signal modulator operates, permits setting of various operating parameters, and permits monitoring of certain conditions during the operation of the signal modulator. In the preferred form of the invention, a Motorola ™, type 68HC11 microcontroller integrated circuit is used for control 40, although many other similar devices can be used in the alternative. Control 40 is programmed to provide its control functions based upon program steps that are stored in a memory 42. Although not separately shown, memory 42 comprises both a random access memory (RAM) for temporary storage of variables and other data, and a read only memory (ROM) for storing the instructions implemented by control 40 to carry out its control functions. A bi-directional address/databus 44 couples memory 42 to control 40.

In addition, control 40 is connected to a control panel/keyboard 46 via lines 48. The control panel/keyboard allows an operator to enter instructions and select values for parameters used by control 40 in controlling signal modulator 32. A display 50 is connected through lines 52 to control 40, providing means for displaying information to the operator. Lines 54 connect an external interface 56 to control 40, permitting a remote video display terminal (VDT) 62 to control signal modulator 32. For example, VDT 62 allows an operator at location that is geographically separate from the location of digital exciter 30 to enter operational parameters used by control 40 and also allows the remote operator to view operational information for the digital exciter through control 40. VDT 62 includes both a keyboard and display (not separately shown), like control panel/keyboard 46 and display 50. The VDT at the remote location is linked to external interface 56 either through a radio link 64, accessing a radio receiver 58 that is interconnected to external interface 56 through a line 60, or alternatively, through a telephone line 66, which links the VDT with external interface 56. Details of external interface 56 and receiver 58 are not shown, since these devices are well known to those of ordinary skill in the art.

Control 40 is coupled to signal modulator 32 through lines 72, which connect to latches 70. Latches 70 comprise an 8-bit and a 16-bit latch (not separately shown) that are coupled to the signal modulator through lines 71. The program run on control 40 is preferably menu driven to facilitate operator selection of parameters used to control signal modulator 32. Using the menu presented on display 50, an operator enters a selection on control panel/keyboard 46 (or on the keyboard at the remotely disposed VDT 62). In response to the operator selection, control 40 writes a 16-bit word to the 16-bit latch of latches 70 and sets a flag bit on the 8-bit latch. After the signal modulator DSP has read the 16-bit word, it resets the flag. Similarly, if the DSP comprising signal modulator 32 is providing status data to control 40, it writes a 16-bit word to the 16-bit latch, and sets a different bit on the 8-bit latch, which control 40 resets after it has read the 16-bit word. Commands from control 40 comprise either one or two 16-bit words, and status data from signal modulator 32 typically comprise a single 16-bit word.

Interaction of signal modulator 32 with control 40 is determined by program instructions loaded into the DSP comprising the signal modulator at the time the system is powered up or reset. A boot memory circuit 68 stores the instructions implemented by both the DSP comprising signal modulator 32 and the DSP comprising interpolator 38 and DQM 36. Boot memory circuit 68 is coupled to signal modulator 32 through lines 69 and to DQM 36 through lines 67. The interrupt instructions stored in boot memory circuit 68 that control the operation of signal modulator 32 are of higher priority than the background operations it implements, which are related to control and interface with control 40. Further details concerning the operation of digital exciter 30 and its interaction with control 40 are discussed below.

Input signals to signal modulator 32 are supplied through different paths, depending upon the type of signal. An analog signal to be modulated, such as voice, is provided from a source (not shown) over a line 74 that is coupled to the input of an analog-to-digital converter (ADC) 76. ADC 76 samples the analog signal supplied on line 74 at a rate of 9765.625 Hz in the preferred embodiment, providing digital values corresponding to the analog signal over a line 78, to signal modulator 32.

An output latch 80 is coupled to signal modulator 32 through data lines 84. In addition, a write enable line 82 is used for latching data into output latch 80. Output latch 80 is used in the context of the present invention only for supplying a clock (CLK) signal for use in synchronizing a source of digital data when operating the digital exciter in a linear modulation mode. The clock signal is output from output latch 80 on a line 86 and is synchronized with one of the data bits supplied by signal modulator 32 over lines 84 to output latch 80. During operation in an asynchronous mode (for FM), the clock signal conveyed on line 86 is not used. Digital data are input (either synchronously or asynchronously) as data bits D0 through D3 on data lines 90a through 90d, respectively, to an input latch 88. During linear modulation of data, the bits provided on lines 90 are read from input latch 88 in synchronization with the CLK signal and are supplied over lines 84 to signal modulator 32. During operation in the asynchronous mode, signal modulator 32 samples the input digital data each time that a read (RD) signal conveyed on a line 96 from signal modulator 32 to input latch 88 goes low. Although eight lines 84 couple input latch 88 with signal modulator 32, only four are used by digital exciter 30 to convey digital input data. In addition, lines 90 convey the four input bits D0 through D3 to an edge detector circuit 92, which determines when the digital data (in NRZ format) changes logic level, producing an edge detect interrupt signal that is input to signal modulator 32 over a line 94. Edge detector circuit 92 and the interrupt signal it produces are used by signal modulator 32 for interpolation of the sampled values during operation in asynchronous FM mode, as explained below.

Signal modulator 32 can operate on either two level or four level digital input data. During asynchronous operation, the DSP comprising signal modulator 32 does not directly know when a bit begins or ends. Accordingly, signal modulator 32 uses two interrupt routines, including a timer routine and an external interrupt routine in conjunction with the interrupt signal produced by edge detector 92. The timer interrupt occurs at an internal frequency of 66⅔ kHz in the preferred embodiment and establishes the rate at which the digital input signal is processed to produce a pair of complex FSK samples that are output from the signal modulator. Similarly, when operating in a synchronous mode, signal modulator 32 also produces a complex output signal having both amplitude and phase modulation that are conveyed on lines 100 and 102 to the input of interpolator 38.

Interpolator 38 interpolates the complex signal conveyed on lines 100/102 from the 66⅔ kHz sampling rate by a factor of six, yielding a 400 kHz signal. DQM 36 then modulates the sampled signals from the base band to a first 100 kHz intermediate frequency (IF). The quadrature modulated signals are combined and output on a line 108 from DQM 36, for conversion to an analog signal by a digital-to-analog converter (DAC) 110. The modulated output signal is then up converted from the 100 kHz frequency by multiplication with a 89.9 MHz signal produced by a first local oscillator 116. The 89.9 MHz signal is supplied on a line 118 to a multiplier 114 that is coupled to receive the 100 kHz signal, and the multiplier produces an output frequency of 90 MHz that is conveyed on a line 120 to a bandpass filter 122, which eliminates harmonic distortion; the 90 MHz signal is a second IF signal. The second IF signal is output from bandpass filter 122 to a multiplier 126 and further up converted to an output frequency of 900 MHz by multiplication with a 810 MHz signal produced by a second local oscillator 128 that is supplied to multiplier 126 over a line 130. The output signal is conveyed on a line 132 to a power amplifier (not shown).

Operation in FM Mode with Digital Input Data

Figure 2A:
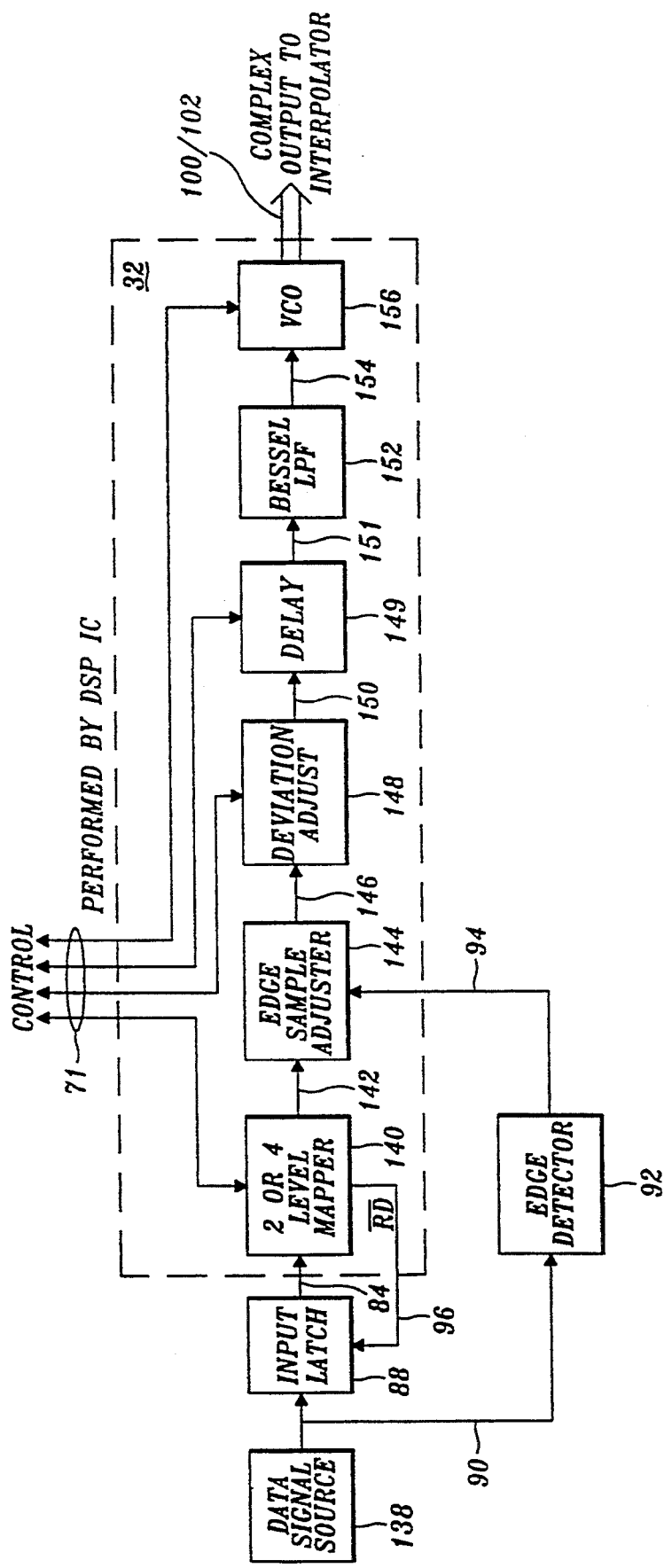
FIG. 2A is a functional block diagram of the signal modulator portion of the digital exciter, operating in a data FM mode.

A functional diagram of signal processor 32 is shown in FIG. 2A, illustrating the various operations performed by the signal processor in modulating an NRZ digital input signal during operation in the FM mode. The digital data is provided by a data signal source 138 and as previously described, is supplied both to input latch 88 and to edge detector circuit 92. Signal modulator 32 comprises a series of functional blocks that sequentially process the sampled digital values to produce the complex signal that is provided to interpolator 38. The data bits that are provided through input latch 88 are read at a 66⅔ kHz sample rate and input over line 84 to a two or four level mapper block 140, which maps the bits that it reads to a normalized level corresponding to the levels shown in Tables 1 and 2, below.

TABLE 1

Two Level Data

| Data Line 1 | Level |
|---|---|
| 1 | +1 |
| 0 | −1 |

TABLE 2

Four Level Data

| Data Line 2 | Data Line 1 | Level |
|---|---|---|
| 1 | 0 | +1 |
| 1 | 1 | +⅓ |
| 0 | 1 | −⅓ |
| 0 | 0 | −1 |

The digital data from data signal source 138 that is sampled by input latch 88 in response to the read enable signal has values that correspond either to a binary 1 or zero. The binary values of the sample data thus relate to the mapping of that data to specific levels. The DSP comprising signal modulator 32 works with values that are normalized over the range −1 to 1, corresponding to a range of digital values from −32,767 through 32,767. The two or four level mapper 140 uses a mapped level for the sample data for successive input samples until the next "edge" occurs, corresponding to a transition of the input data from one logic level to a different logic level, i.e., from a binary 1 to a binary 0 or vice versa. The mapped levels for the data are supplied through a line 142 to an edge sample adjuster block 144. The first mapped sample that occurs immediately after a data edge is detected by edge detector circuit 92 is adjusted by edge sample adjuster block 144 as described below, to reduce jitter that would otherwise occur in determining the digital value that should be applied to a sample if only level mapping were applied, since the sample is not made at a point necessarily synchronous with the transition between binary logic levels of the input data signal. One of the functional parameters that can be selected by an operator is the inversion of the sample data before mapping occurs. The command to invert or not invert data is supplied by control 40 over one of the lines 71, as an input to 2/4 level mapper block 140.

If the asynchronous data signal from data signal source 138 were sampled without edge sample adjustment, the results would be an inherent jitter of ±7.5 microseconds (for sampling at a 66⅔ kHz rate). This jitter occurs because the sampled input data signal would have a zero crossing at some point midway between the points where the actual samples are taken on either side of the edge. For use of digital exciter 30 in a simulcast paging system, a maximum allowable transmitted data jitter is ±0.5 microseconds. Accordingly, it is necessary to adjust the digital amplitude of the sample after a data edge occurs by an amount proportional to the distance of the edge from the sample just prior to the edge. FIGS. 5 and 6 illustrate the procedure for adjusting the edge sample to reduce jitter. In FIG. 5, a digital NRZ signal having a binary logic level 1 (at reference numeral 250, corresponding to an NRZ value +1) transitions at an edge 252 to a logic level zero (at reference numeral 254), corresponding to an NRZ value-1. Subsequently, the signal transitions at an edge 256 to a logic level 1 (represented by a line segment 258). Corresponding sample values are taken at times indicated in FIG. 6 by successive dots appearing along line segment 250', with an interval $t_{max}$ separating consecutive samples. All of these samples have a mapping level corresponding to +1. However, a sample 251 taken immediately before transition 252 occurs is adjusted to a value equal to approximately 0.7 based upon the time interval t between that sample and transition 252 (or 252'). Similarly, a sample 255 is assigned an edge adjusted value of approximately −0.8. The amplitude x(i) is determined as follows:

$$x(i) = q(i-1) + \text{shift} \tag{1}$$

$$\text{shift} = \frac{(q(i) - q(i-1))*(t_{max} - i)}{t_{max}} \tag{2}$$

In Equation 2 above, q(i) is the normalized level after an edge has occurred and q(i−1) is the normalized level of the input data signal before the edge. Using this technique, a peak jitter rate less than ±350 nanoseconds can be obtained, the performance being diminished slightly by the time required for the DSP to execute instructions, which prevents its response to an edge detect signal for a brief period of time.

To obtain a desired deviation in the instantaneous output frequencies relative to a carrier frequency, the normalized samples produced by mapping and adjusting for edge interpolation are conveyed over a line 146 to a frequency deviation adjustment block 148, where the signal is scaled by a frequency deviation factor. An operator can select the desired frequency deviation, which control 40 supplies to frequency deviation adjustment block 148 over one of the lines 71. The operator specified frequency deviation value is divided by a voltage controlled oscillator (VCO) limit used by a VCO block 156, to obtain the frequency deviation used, and this value is retained until reset to a different value.

Following frequency deviation adjustment block 148, the signal is supplied over a line 150 to a delay block 149. Delay block 149 delays the signal on line 150 by a time interval specifically selected to equalize the processing time incurred during signal modulation of digital input data signals and the processing time required to signal modulate analog input signals. This equalization delay ensures that when signal modulator 32 is switched over from an analog mode to a data mode (or vice versa), that substantially no difference in the signal modulation processing time is observed. This equalization of the signal modulation time required for both types of signals is particularly important in simulcast paging transmissions. This delay interval can be adjusted by the operator via command signals that are conveyed from control 40 to delay block 149 over one of lines 71. The operator can thus select a delay time that insure the modulated signal produced by exciter 30 is synchronized with corresponding modulated signals transmitted from other transmitters in a simulcast radio system.

Figure 9:
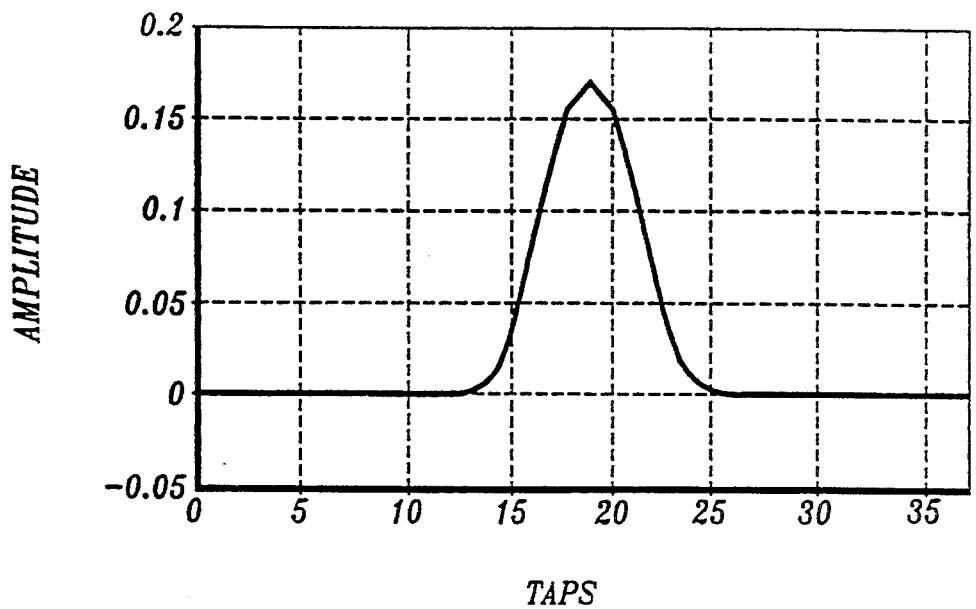
FIG. 9 is a graph of tap values and normalized amplitude, for a Bessel pre-modulation filter in the digital signal modulator portion of the digital exciter.
Figure 10:
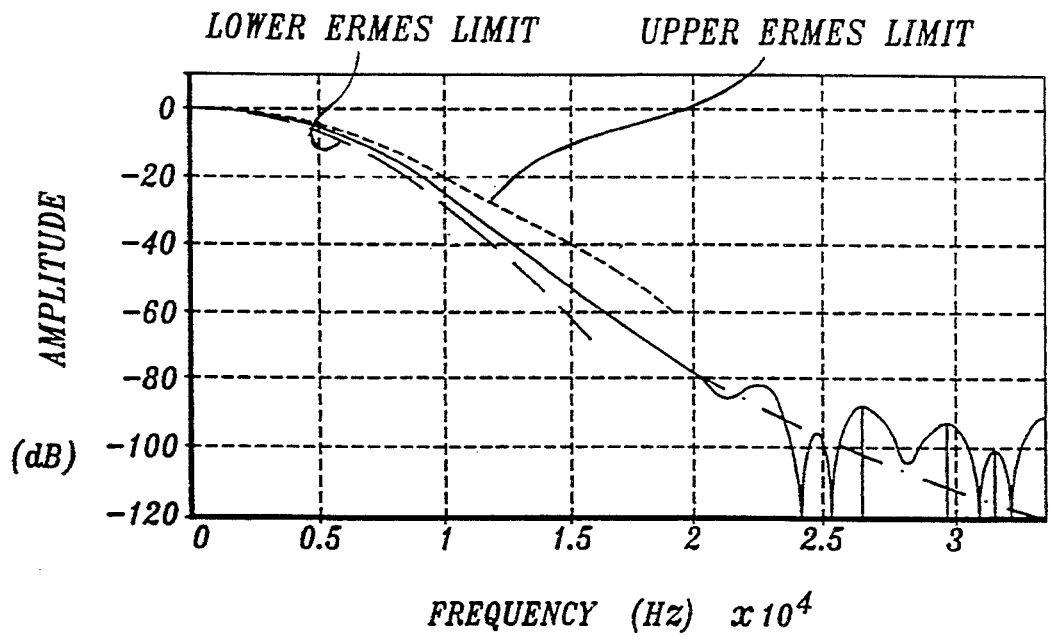
FIG. 10 is a graph of the frequency response of the pre-modulation filter of FIG. 9, in terms of amplitude in dB relative to frequency.

A line 151 conveys the delayed signal to a Bessel low pass filter (LPF) block 152, which processes the signal by convolving it with a 37 tap Bessel-type finite impulse response (FIR) filter that meets the ERMES specifications for a pre-modulation pulse shaping filter. The Bessel LPF block acts as an "anti-splatter" filter to ensure that the power spectral density of the transmitted signal lies within a frequency domain determined in accordance with limits established by the Federal Communications Commission (FCC). Tap values for the Bessel LPF are illustrated in FIG. 9. These tap values were determined by matching the frequency response to a ten pole Bessel filter having a cut-off frequency of 3.9 kHz. FIG. 10 illustrates the frequency response of the Bessel LPF block in comparison to the upper and lower ERMES limits. The dash-dot line represents the frequency response of the ten pole analog Bessel filter used to develop the 37 tap values. Bessel LPF block 152 achieves a stop band attenuation of approximately 90 dB.

Figure 11:
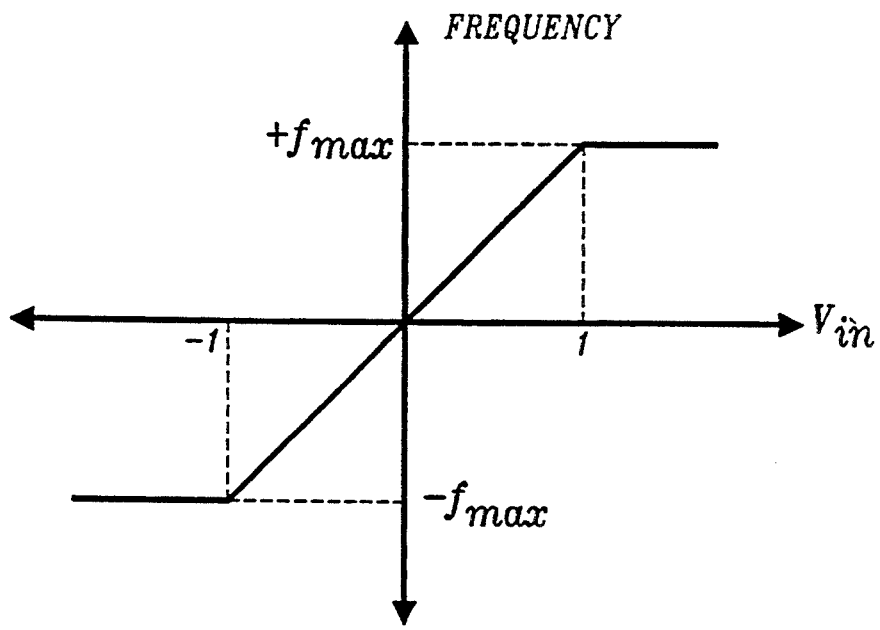
FIG. 11 graphically illustrates the transfer function of a voltage controlled oscillator in the signal modulator, showing the relationship between voltage and frequency.

The filtered signal from Bessel LPF block 152 is conveyed on a line 154 to VCO 156 for use in frequency modulating the base band carrier conveyed on lines 100 and 102. A linear transfer function for VCO 156 is illustrated in FIG. 11. The slope of the linear response for VCO 156 is $f_{max}$ Hz/V, where $f_{max}$ is the VCO deviation limit, i.e., the largest frequency deviation from the carrier frequency that is possible. The VCO limit value can be changed by the operator selecting a VCO limit value, which is supplied to VCO 156 over one of lines 71, through latches 70 and lines 72. The signal input to VCO 156 is multiplied by the slope of the transfer function, thereby representing each of the sampled filtered values as instantaneous frequency values. A limiter is employed in VCO 156 to prevent the output from exceeding the VCO deviation limit. The complex samples output from VCO 156 are defined by the following equation:

$$y(n) = \cos\theta(n) + j\sin\theta(n) \tag{3}$$

In Equation 3, the instantaneous phase of the output, $\theta(n)$, is determined in a form that represents an index to a stored sine lookup table, depending upon the filtered sampled values that are input. Greater resolution in determining cosine and sine values is obtained by performing a second order interpolation on the lookup table values, as explained below. The cosine/sine lookup table is stored in the internal memory (not separately shown) of the DSP comprising signal modulator 32 and is loaded from boot memory circuit 68 when digital exciter 30 is powered up or reset. In a preferred embodiment, the lookup table stores sine values for 128 uniformly spaced angles ranging from zero to approximately $2\pi$ ($127 \times 2\pi/128$) around a unit circle. A table index, $\theta(n)$, is incremented at each sample instant by $\Delta(n)$ and by $\Delta_{off}$. The value $\Delta(n)$ is calculated from the value of the filtered input sample provided to VCO 156 and the value $\Delta_{off}$ is calculated from a desired frequency offset, which can be changed by the operator using control 40 to supply the desired value to the VCO. The following equations define these values:

$$\theta(n) = \theta(n-1) + \Delta(n) + \Delta_{off} \tag{4}$$

$$\Delta(n) = \frac{N \times f_{max} * \text{input}(n)}{f_s} \tag{5}$$

In the above equations, N is the number of elements in the sine lookup table (128), and $f_s$ is the sampling frequency (66⅔ kHz).

Figure 8:
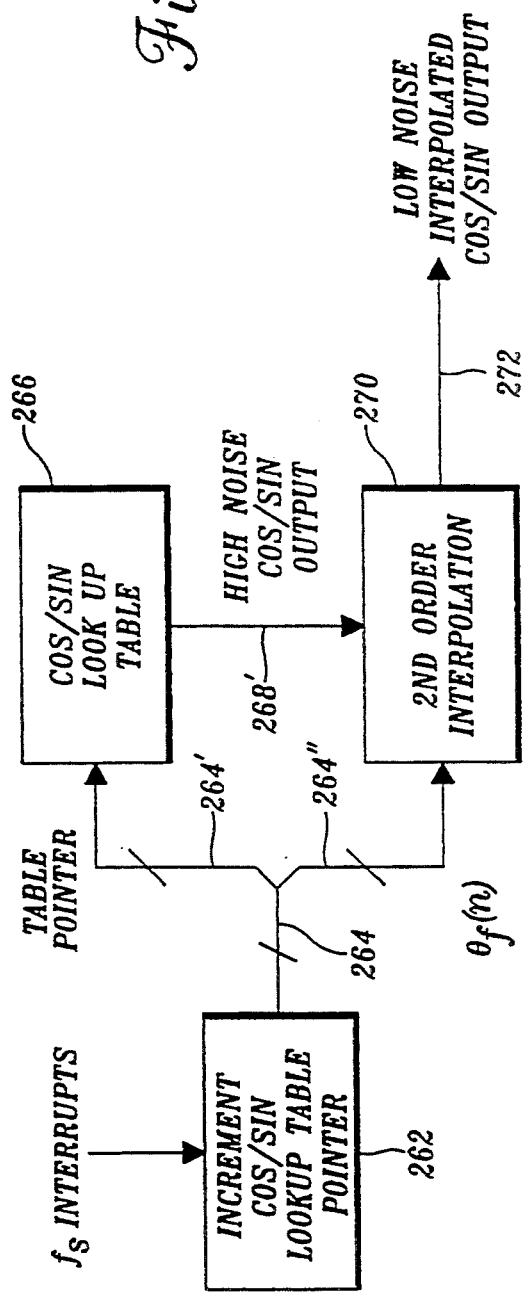
FIG. 8 is a functional block diagram of the process for interpolating the values of the sine/cosine between values stored in the lookup table.

The technique used for determining a sine or cosine value based upon the sine lookup table and interpolation for angles between the 128 points stored in the table are illustrated in FIG. 8. The sampled filtered values resulting from timed interrupts at the 66⅔ kHz rate are used to develop pointer $\theta(n)$ in a block 262, yielding 16 bits represented by line 264, which are split between the seven most significant bits (MSBs) indicated by line 264' and the nine least significant bits (LSBs), represented by line 264''. The seven MSBs of the pointer are used for pointing to the specific values in the lookup table as indicated in a block 266, while the nine LSBs are used to carry out a second order interpolation in a block 270 to improve the resolution with which sine and cosine are determined for angles other than the 128 contained within the lookup table. A line 268 represents the value determined from the lookup table based upon the seven MSBs of the pointer, which is applied to the second order interpolation block. The output of the second order interpolation block is represented by a line 272 and corresponds to a low-noise interpolated cosine/sine output.

Figure 7:
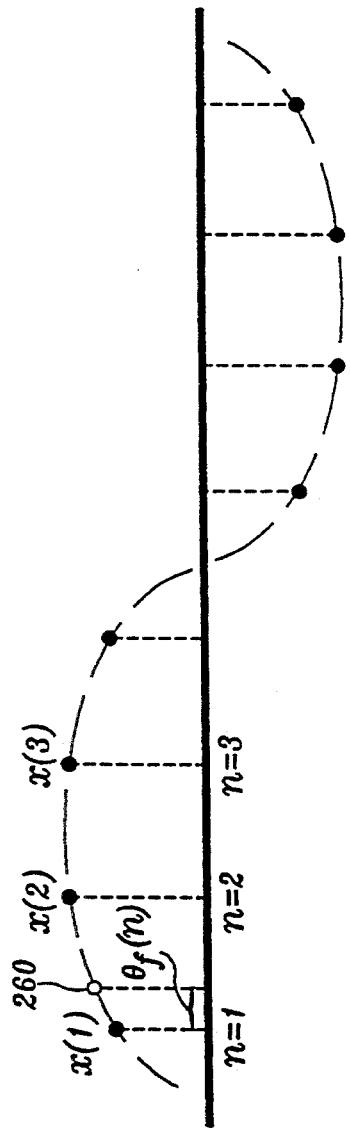
FIG. 7 is a graph of a sine wave over time, illustrating how values for sine and cosine are interpolated between values for the functions stored in a lookup table to improve resolution.

Second order interpolation block 270 performs two second order interpolations to calculate sine and cosine values, as is well known to those of ordinary skill in the art. For each interpolation, three table values are used as supplied over line 268 from lookup table block 266. Cos $\theta(n)$ is determined in a similar manner. FIG. 7 is a simplified illustration of the process showing how a fractional value is used to determine the sine of an angle at a point 260, which is intermediate to lookup table points or angles $x(1)$ and $x(2)$. The calculation also requires a lookup table value at an angle $x(3)$. Of course, the simplified illustration in FIG. 7 represents only a few points (that would be stored in a lookup table) instead of the 128 used in the preferred embodiment. It is also possible to use a table in which fewer points are stored and to use a third order or higher order interpolation. The output from VCO block 156 comprises the complex signal conveyed on lines 100/102, which is input to interpolator 38.

Signal Modulator for Linear Modulation of Digital Input Data

Figure 2B:
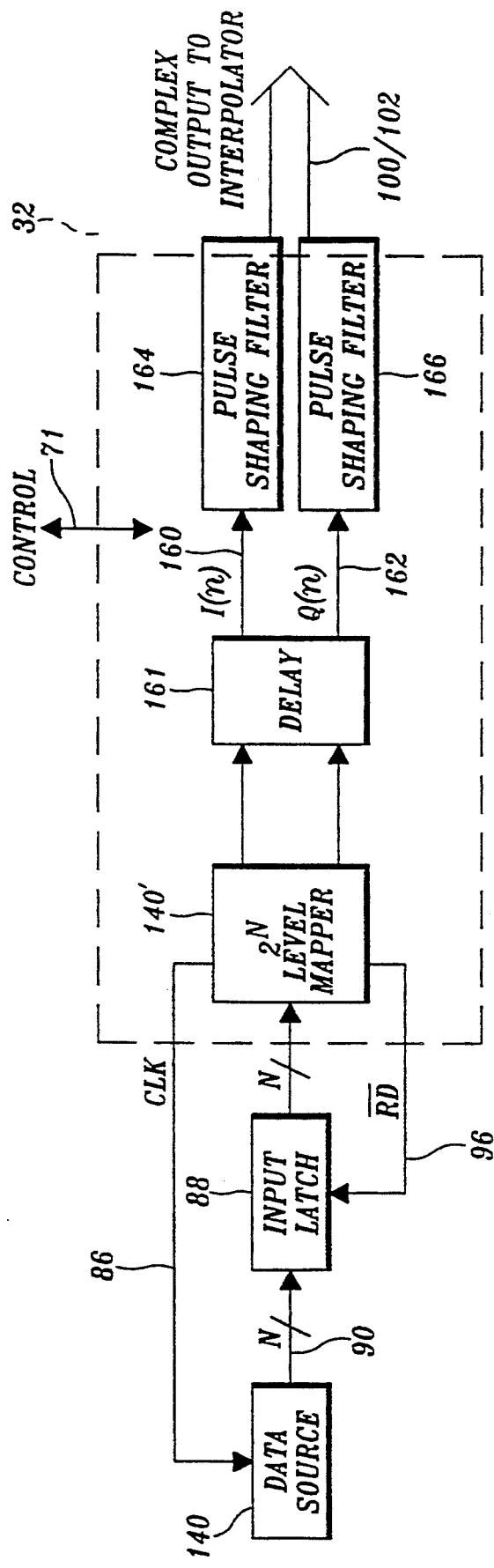
FIG. 2B is a functional block diagram of the signal modulator portion of the digital exciter, operating in a linear data modulation mode.

Referring now to FIG. 2B, a block diagram for linear modulation as carried out by signal modulator 32 is illustrated. Data source 138 supplies NRZ digital data to input latch 88 over lines 90. However, for linear modulation, the data source is clocked by the clock signal CLK provided by DSP 32 so that the data is provided to input latch 88 synchronously with the read enable signal provided the input latch over a line 96. More than one bit of data can be sampled at a time; the transmitted data rate can therefore exceed 64 kilobits/sec. Furthermore, these digital input data may comprise digitally compressed voice signals for use in a digital voice paging system.

In FIG. 2B, output latch 80 is omitted to simplify the diagram, since its sole purpose is to feed through the clock signals from a $2^N$ level mapper block 140'. Because the NRZ data is sampled synchronously, edge detector circuit 92 is not required. In addition, there is no requirement for adjusting the edge to compensate for samples taken at other than zero crossing transitions of the NRZ data.

Figure 27:
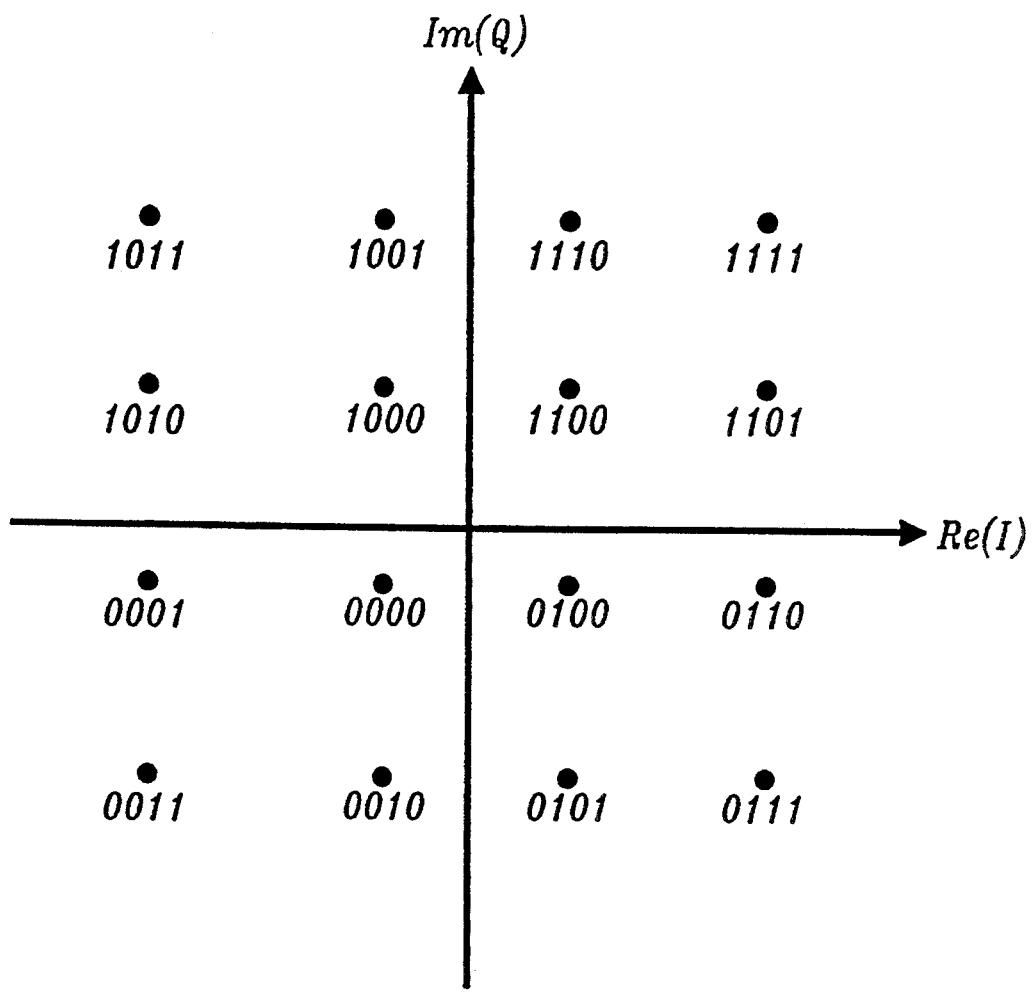
FIG. 27 is a graph showing the signal constellation for 16 QAM linear modulation.

The $2^N$ level mapper of FIG. 2B maps each input data symbol, $d(n)$, into a corresponding constellation point on the complex plane. FIG. 27 shows a mapping for 16 QAM linear modulation, which has four data bits per data symbol. An impulse of the constellation point for $d(n)=I(n)+jQ(n)$ is fed into the pulse shaping filters (which preferably comprise low pass filters) at the data symbol rate. The output of the pulse shaping filters is the sampled continuous time signal $I(t)+jQ(t)$, which is the complex baseband signal. This signal is then interpolated by interpolator 38 and the interpolated signal is conveyed to DQM 36, which produces a signal $I(t)\cos(2\pi f_c t)-Q(t)\sin(2\pi f_c t)$.

The unfiltered complex base band conveyed from the $2^N$ level mapper block are respectively applied to a delay block 161 that provides a modulation delay interval specified by the operator. The delayed complex signal is conveyed over lines 160 and 162 to pulse shaping filters 164 and 166. These pulse shaping filters comprise FIR filters that provide a desired envelope to the complex output signal conveyed on lines 100/102 to the interpolator. Lines 71 convey signals from control 40 to signal modulator 32, enabling operator selection of the digital signal modulation delay and other parameters in much the same way as described above in connection with the FM modulator shown in FIG. 2A.

Details of the Signal Modulator for Analog (Voice) Input

Figure 3A:
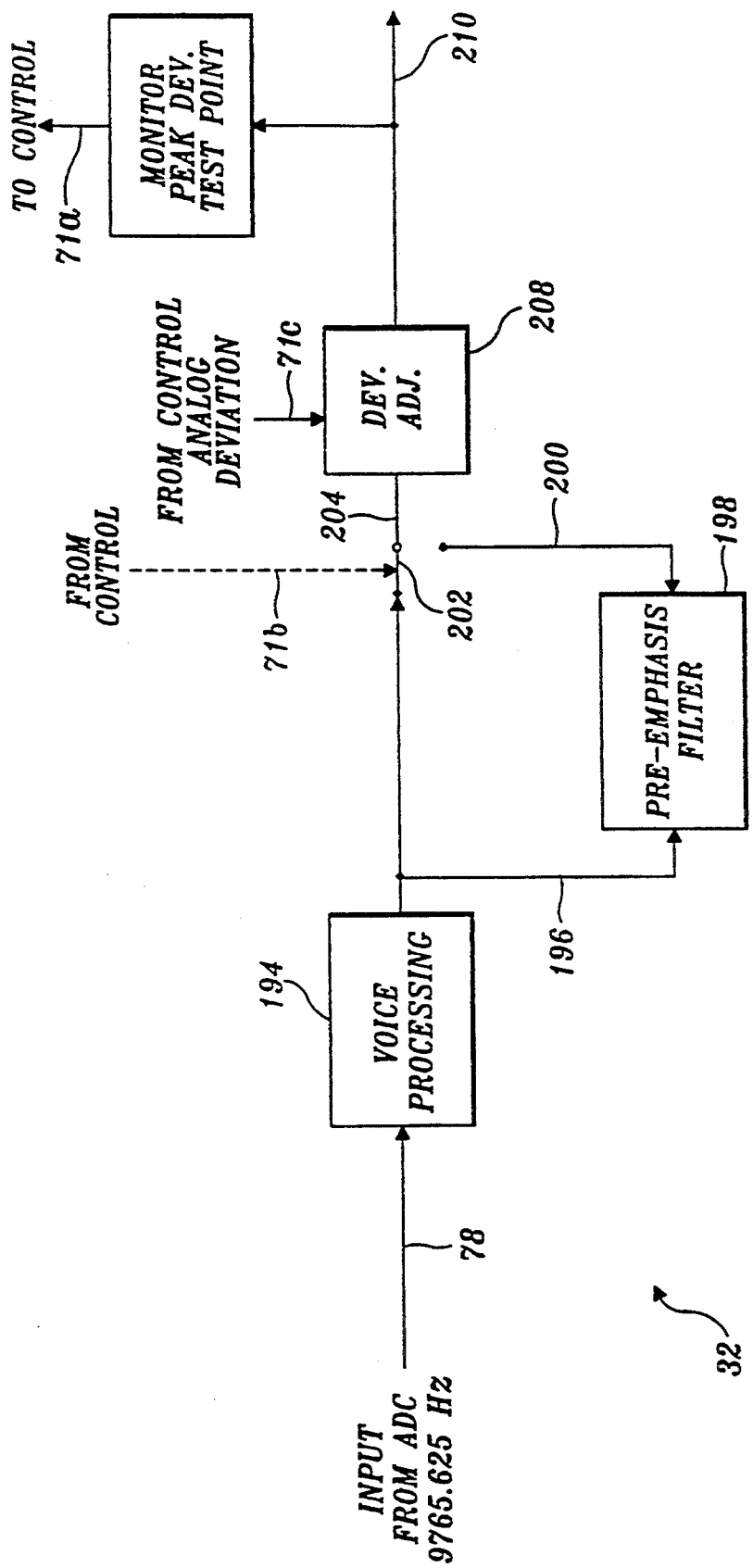
FIGS. 3A and 3B are two parts of a functional block diagram of the signal modulator, as used for modulating an analog input signal, in an FM mode.
Figure 3B:
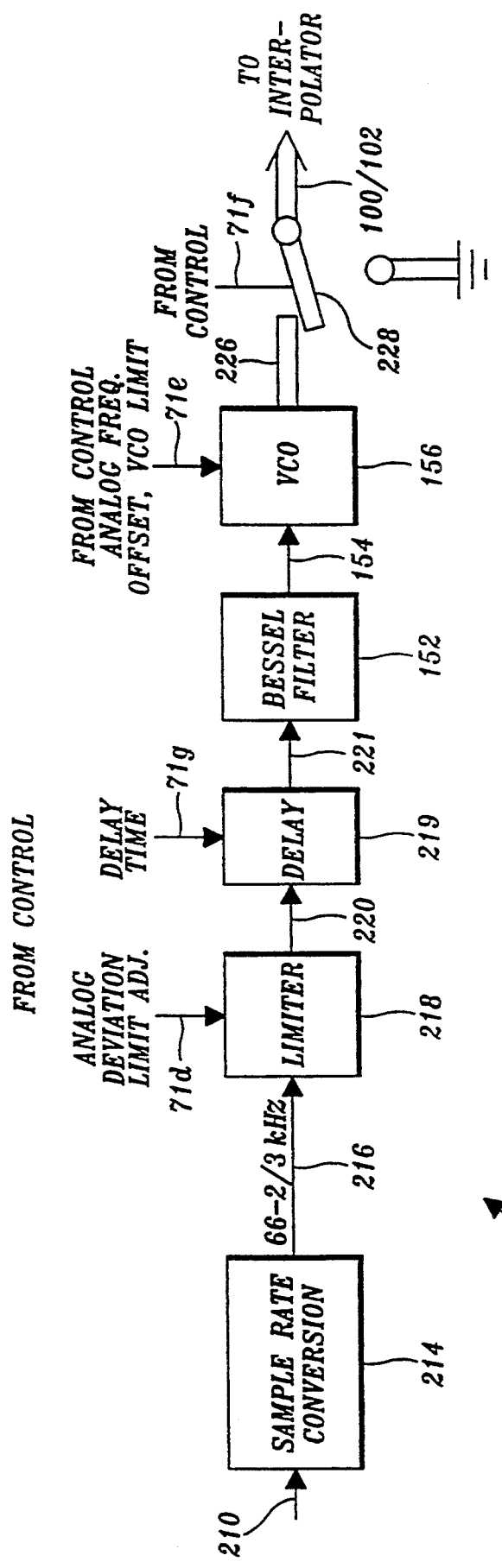

Turning now to FIGS. 3A and 3B, details of the functional modulation blocks implemented by signal modulator 32 in processing an analog signal, specifically voice, are illustrated. The samples produced by ADC 76 at the 9765.625 Hz rate are input on line 78 to a voice processing block 194, which band pass filters the signal and adjusts its phase. A pre-emphasis filter 198, having an input connected to the filtered and phase compensated signal from voice processing block 194 can be selectively applied to provide pre-emphasis of a voice signal. A line 71b carrying a signal from control 40 via latches 70 controls a logic switch 202 (actually a software flag) that determines whether or not pre-emphasis filter 198 is applied to the sequential processing of the filtered and phase compensated signal on line 196. If so, switch 202 selects the output signal on a line 200 from pre-emphasis filter block 198, passing that signal to a line 204 as input to an analog frequency deviation block 208. Otherwise, switch 202 bypasses the pre-emphasis filter block. Frequency deviation block 208 is used to set the frequency deviation for the voice signal samples by a value selected by the operator and supplied over line 71c.

Referring to FIG. 3B, the signal output from deviation adjustment block 208 is input on a line 210 to a sample rate conversion block 214. The sample rate conversion block uses a combination of a fixed and a linear interpolation process to raise the effective sampling rate to 66⅔ kHz. The signal output from sample rate conversion block 214 on a line 216 at 66⅔ kHz is input to a deviation limit adjustment block or limiter 218 having a deviation limit equal or less than the VCO frequency deviation limit, as determined by an operator selected input conveyed from control 40 through a line 71d. The frequency limited signal from limiter 218 is conveyed on a line 220 to a delay block 219 and delayed for a time interval selected by the operator (via a signal conveyed on a line 71g from control 40), so that the modulated signal produced by digital exciter 30 is synchronized with all of the corresponding transmissions from other transmitters in a simulcast radio system. The delayed signal is conveyed through a line 221 to Bessel LPF block 152, which performs the functions already described above, and the output of the Bessel LPF block is conveyed to VCO 156, which produces the complex output signal.

As shown in FIG. 3B, the complex signal from VCO 156 is preferably conveyed on lines 226 to a logic switch 228, which is selectively controlled by the operator using control 40. If desired, the operator can elect to ground the output from signal modulator 32, cutting off all transmissions from digital exciter 30. A line 71f conveys the signal that controls logic switch 228, from control 40 through latches 70. The output from logic switch 228 is coupled to lines 100/102 as noted above, which are connected to interpolator 38.

Figure 4:
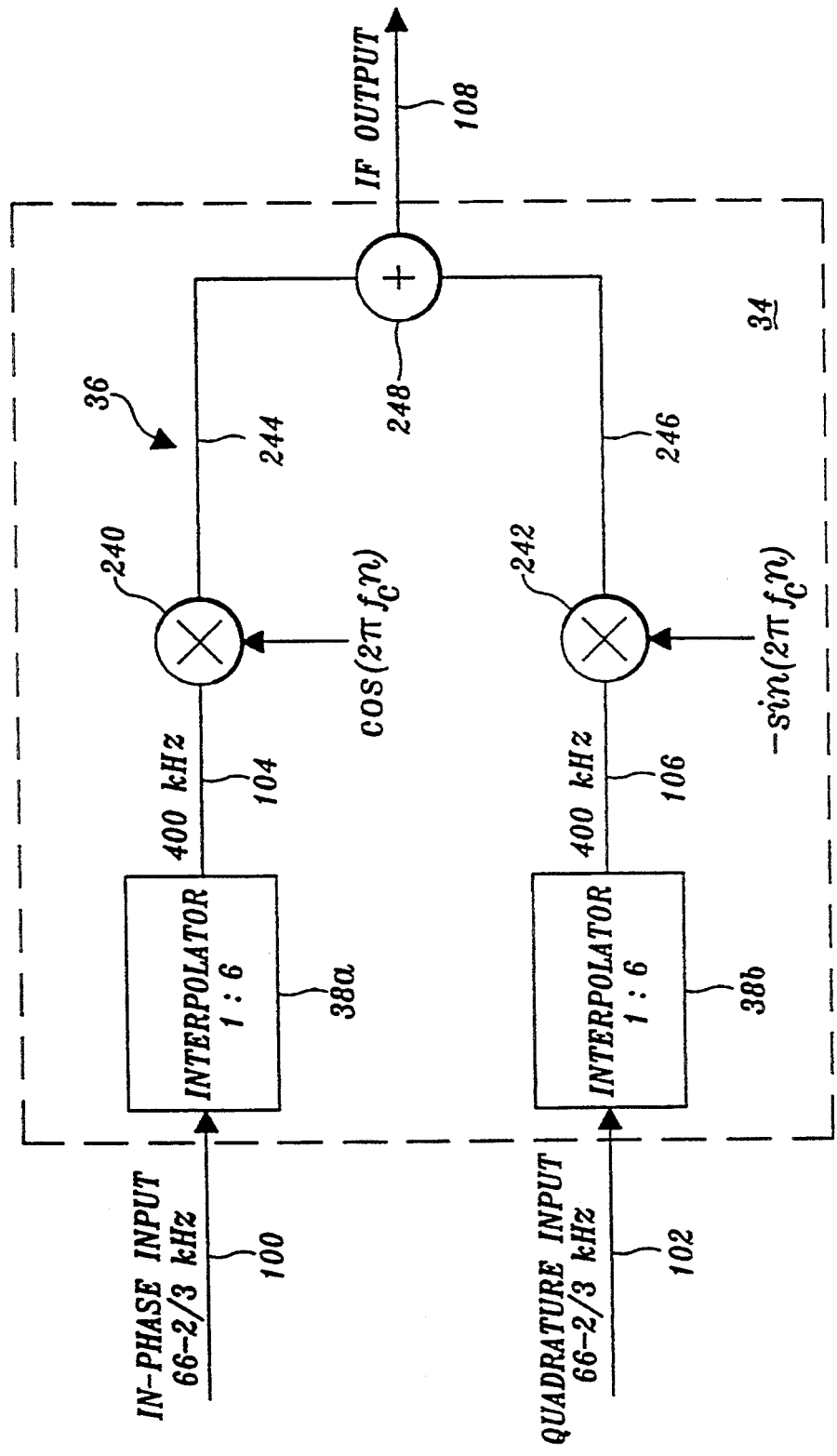
FIG. 4 is functional block diagram of the interpolator and digital quadrature modulator (DQM) portion of the digital exciter.
Figure 12:
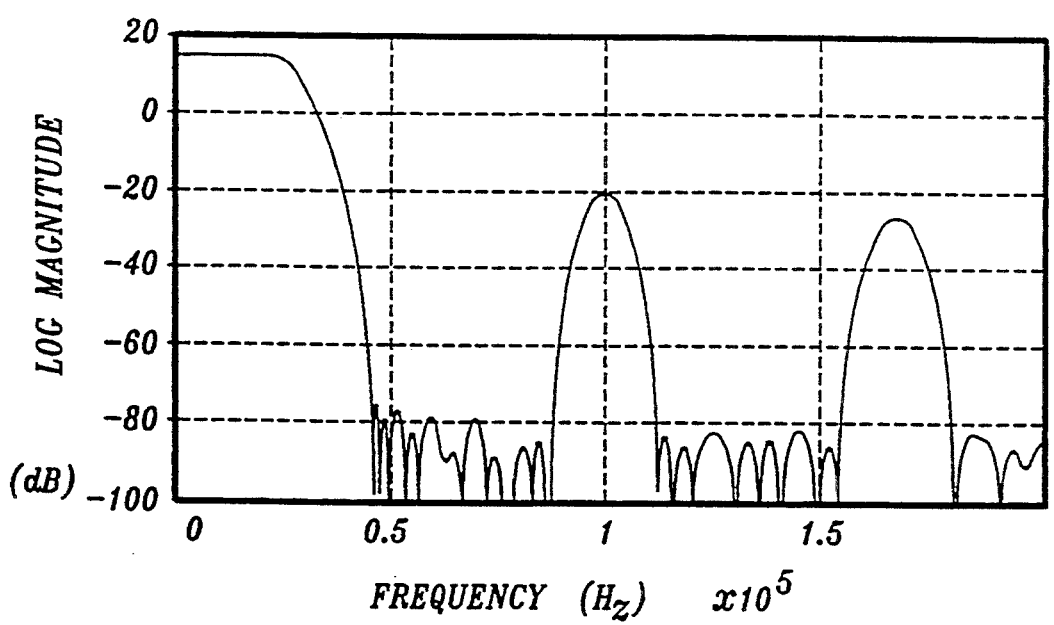
FIG. 12 is a graph showing the positive portion of the frequency response of the DQM interpolation filter, in terms of dB and frequency.

In FIG. 4, functional details of DQM 36 are shown. A DSP 34 carries out the functions of DQM 36 and interpolator 38. Accordingly, line 100 is coupled to an interpolator 38a that provides a 1 to 6 interpolation, increasing the 66⅔ kHz sample rate of the in-phase component of the complex signal that is input, to 400 kHz. Similarly, an interpolator 38b receives the quadrature component of the complex signal on line 102 at 66⅔ kHz, and provides a 1 to 6 interpolation, yielding an output signal at 400 kHz that is conveyed on line 106. Interpolators 38a and 38b comprise 84-tap multiband FIR filters having a frequency response as shown in FIG. 12 (the negative portion of the frequency response having been omitted to simplify the graph). Since the multiband FIR filter used for interpolators 38a and 38b is used after five zeroes are inserted between every two data samples input to the interpolator, for any interpolation, only 14 taps will have non-zero input samples. Accordingly, the 84-tap filter can be converted into six filters of 14 taps that are applied in succession.

The 400 kHz in-phase and quadrature signals from interpolators 38a and 38b are respectively input to multipliers 240 and 242. Multiplier 240 multiplies the 400 kHz in-phase component by $\cos(2\pi f_c n)$ and multiplier 242 multiplies the quadrature component by $-\sin(2\pi f_c n)$. The value $f_c$ is the first IF frequency of 100 kHz. Since the sampling rate is exactly four times this IF frequency, only integer sine and cosine values need to be stored to carry out the multiplication. Since these values are exact, there is no quantization error. The in-phase and quadrature components conveyed on lines 244 and 246 are then input to an adder 248 to combine the signals, producing the first IF output signal on line 108. DQM 36 thus produces an output modulated signal at 100 kHz having a time bearing value $V_{IF}(t)$, defined by the following equation:

$$v_{IF}(t) = v_I(t) \cos(2\pi f_c t) - v_Q(t) \sin(2\pi f_c t) \quad (7)$$

DQM 36 alternates between interpolations of the two component of the complex signal. Up conversion of the 100 kHz intermediate frequency output from DQM 36 to obtain a carder frequency of 900 MHz was explained above.

Operation and Control of the Digital Exciter

Digital exciter 30 can be selectively operated in one of the plurality of possible modes, including the two level FSK mode, four level FSK mode, flat analog(-voice) mode and pre-emphasized analog (voice) mode. In addition, the modulation can be selectively set to FM or linear. Control of the operational mode is available to the operator through control 40 on a menu provided on display 50. The operator can choose between 12 commands to change parameters of operation of the digital exciter. Three of the 12 commands affect the operation of digital exciter 30, regardless of the mode that it is in, and five of the commands affect its operation in two level or four level digital data mode. Four of the commands affect operation of the digital exciter in either the flat or pre-emphasized analog mode. Upon hardware reset of the digital exciter, these command parameters are initialized to default values.

One of the three commands that affects the exciter's operation, regardless of the mode selected, is the command that sets the deviation limit of VCO 156. This deviation limit specifies the largest possible deviation of the instantaneous frequency of the output signal from the carrier frequency and can be set to an integer value between ±15 kHz in steps of 1 Hz. In addition, regardless of the mode of operation (although not shown in all of the figures) logic switch 228 can be set to stop transmission of the modulated signal by grounding the output from signal modulator 32. This feature enables an operator to determine the status of digital exciter 30, without transmitting a signal, or to temporarily stop the transmission of a modulated signal.

Control 40 also enables the operator to offset the carrier frequency for two or four level data from its default value over a range of ±2,048 Hz, in steps of 1 Hz. The operator can change the FSK data deviation, which is a deviation of the instantaneous output frequencies from the center frequency for the two level or four level data signal modulation, over a range of ±15 kHz, in steps of 1 Hz (up to the VCO limit). Two commands affect mapping of the logic levels that signal modulator 30 reads from the NRZ digital input data as shown on Tables 1 and 2, including an invert data command and a non-invert data command. One of the operator commands effects the adjustment of the variable delay in the modulation of the input signal by the digital exciter.

During operation with an analog input signal, signal modulator 30 can be commanded to offset the carrier frequency from its default value independent of an offset chosen when operating with digital data. Again, the offset can be any integral value in the range ±2,048 Hz in steps of 1 Hz. Further, the operator can control the analog deviation limit, which specifies the largest possible deviation of the instantaneous frequency of the output signal from the carrier frequency. This deviation limit can be set to any integer value in the range ±15 kHz in steps of 1 Hz, subject to the VCO deviation limit. To control the time required for the modulation of an analog input signal, one of the operator commands sets the variable delay in the digital exciter.

Control 40 can also interrogate signal modulator 32 to determine its status, including requesting that the signal modulator return a value indicating its current mode of operation. In addition, the peak frequency deviation caused by the input sampled values can be requested. Further, an input signal detect can be requested by control 40, which informs the operator whether the digital exciter is receiving an input signal, based upon whether or not bit transitions are occurring. For operation with an analog input, signal modulator 30 can also determine and advise control 40 of whether the deviation is exceeding 50% of the peak deviation. When edge transitions or peak deviations in excess of 50% are detected by signal modulator 32, it produces a bit flag indication that control 40 uses to inform the operator that an input signal is active.

Figure 13:
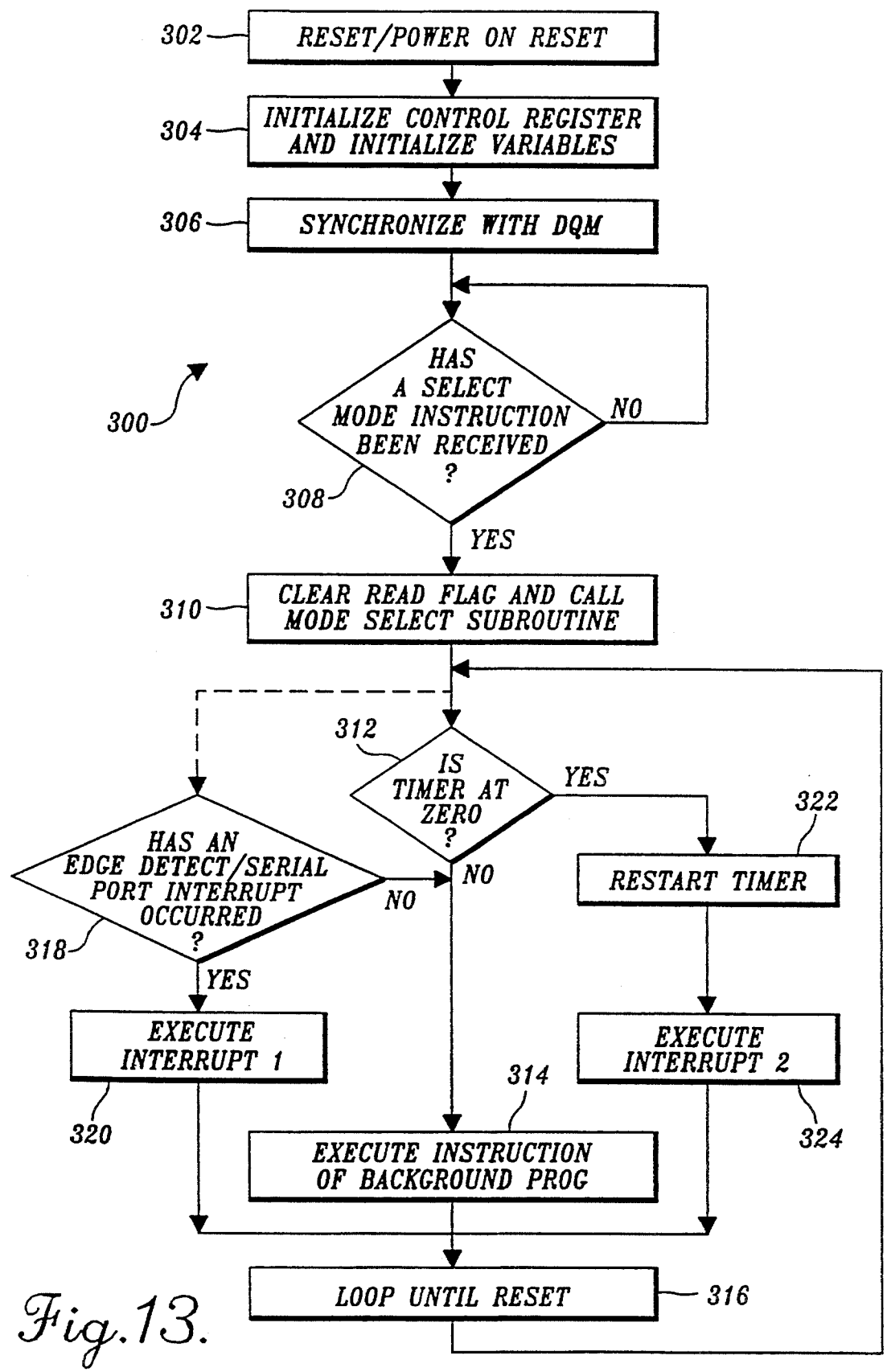
FIG. 13 is a flow chart illustrating the logic steps of the signal modulator reset routine.

The remaining drawing figures, FIGS. 13 through 26, are flow charts that define the operation of digital exciter 30, with respect to its interaction with signal modulator 32. Turning first to FIG. 13, a reset routine for signal modulator 32 is illustrated in a flow chart 300. A reset routine implemented by the digital exciter starts at a step 302, when the device is reset or powered on. Step 302 causes initialization of the control registers that establish the operation of signal modulator 32, and a step 304 initializes variables used by it. In a step 306, a delay is provided that is necessary for synchronization of signal modulator 32 with DQM 36. This delay is sufficiently long so that the signal modulator is assured that DQM 36 has completed its initialization operation.

A decision block 308 comprises a loop wherein the signal modulator determines if a select mode instruction has been received from control 40. If not, the loop continues until the select mode instruction is received, and then proceeds to a step 310 that clears a read flag from latches 70 and calls a mode select subroutine that responds to the data transferred from latches 70 to the DSP. The mode select subroutine enables interrupts 1 and 2. The interrupt 1 routine is used if the digital exciter is operating in an FM mode with two level or four level digital input data and is executed when edge detector circuit 92 generates the edge detect interrupt signal. If signal modulator 32 is operating in a fiat or pre-emphasized analog (voice) mode interrupt 1 is a serial port interrupt that is executed whenever a 16 bit data word is available to be read at a serial port receive register (not separately shown) as a sampled input from ADC 76. Interrupt 2 is a timer interrupt that occurs at a rate of 66⅔ kHz and is coupled to respond to the auto reload timer counter value. The timer counter value is predefined for the DSP, starts at a count of 149, and counts down with each DSP instruction cycle, generating interrupt 2 when 0 is reached. Assuming that signal modulator 32 is operating in a data input signal mode, the occurrence of interrupt 2 disables interrupt 1.

A step 318 determines if an edge detect/serial port interrupt has occurred (the type of interrupt depending upon the operational mode) and if so, executes interrupt 1 in a step 320. Since decision step 318 is only reached upon the occurrence of an edge detect interrupt signal, the logic implemented by the signal modulator normally proceeds to a decision step 312 that determines if the timer is at 0 and if so, restarts the timer in a step 322. If not, or if the results from decision step 318 is negative, the logic proceeds to a step 314 that executes the next instruction of the background program. The background program carries out instructions responsive to commands received from control 40. Following steps 320, 314, or 324, the logic moves to a step 316, causing a loop back to decision step 312 until a reset occurs.

Figure 14:
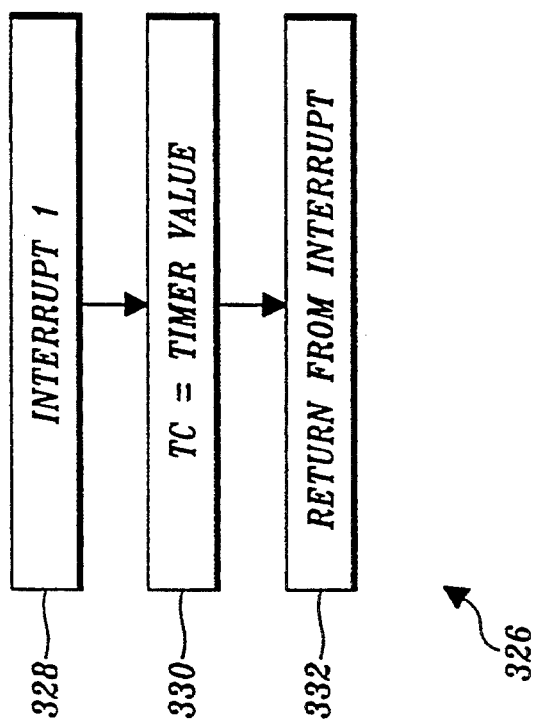
FIG. 14 is a flow chart illustrating the steps for an edge detect interrupt routine used when a data input signal changes state.

FIG. 14 illustrates the steps 326 for interrupt 1, which is carried out when digital exciter 30 is operating in a digital data input mode. Following the occurrence of interrupt 1 in a step 328, a step 330 sets a variable TC (the timer counter) equal to the current timer value, and a step 332 returns from the interrupt.

Figure 15:
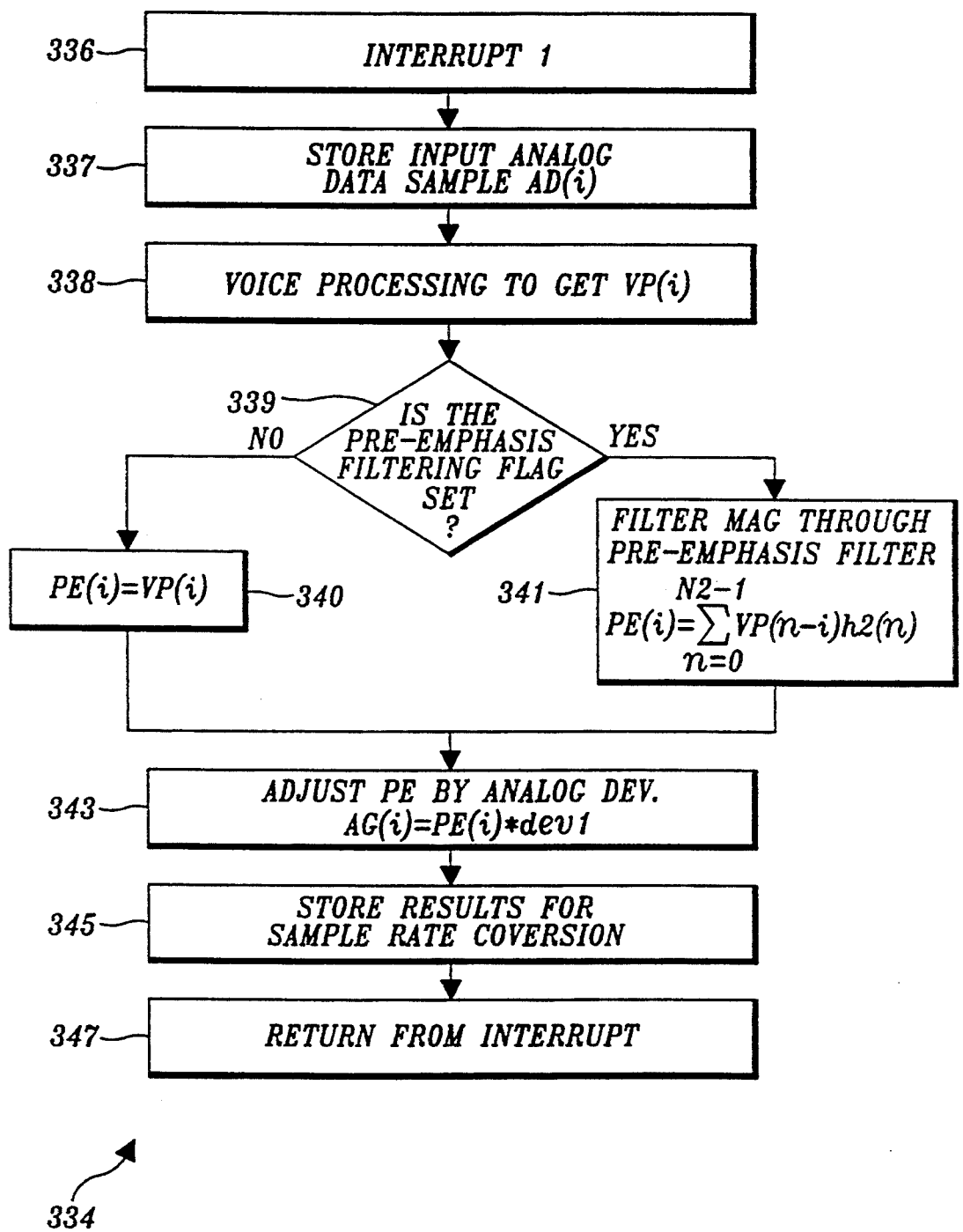
FIG. 15 is a flow chart showing the steps implemented during a serial port interrupt while sampling an analog input signal.

Alternatively, as shown by a flow chart 334 in FIG. 15, if operating in an analog mode, interrupt 1 (a serial port interrupt routine) is executed in a step 336; this interrupt routine occurs at a frequency of 9765.625 Hz, which is the sampling rate of the analog input signal. In a step 337, an input analog data word AD(i) is read from ADC 76 and temporarily stored in an internal memory buffer in signal modulator 32. In step 338, the sample AD(i) is voice processed (filtered) to obtain a filtered sample VP(i). A decision step 339 determines if the pre-emphasis flag (switch 202 in FIG. 3A) is set by the background routine, and if not proceeds to a step 340 that assigns a value PE(i) to VP(i). Conversely, if the operator has selected the pre-emphasis filtering, the logic proceeds to a step 341 that applies the pre-emphasis filter to the magnitude, determining a value PE(i) based on a convolution of VP(i) with coefficients h2(n), carried out in a infinite impulse response filter process. Following either steps 340 or 341, a step 343 adjusts PE(i) by a factor determined based on the operator selected analog frequency deviation, to determine a value AG(i). The results of this determination are temporarily stored in a step 345, and in a step 347, the logic returns from the interrupt.

Figure 16A:
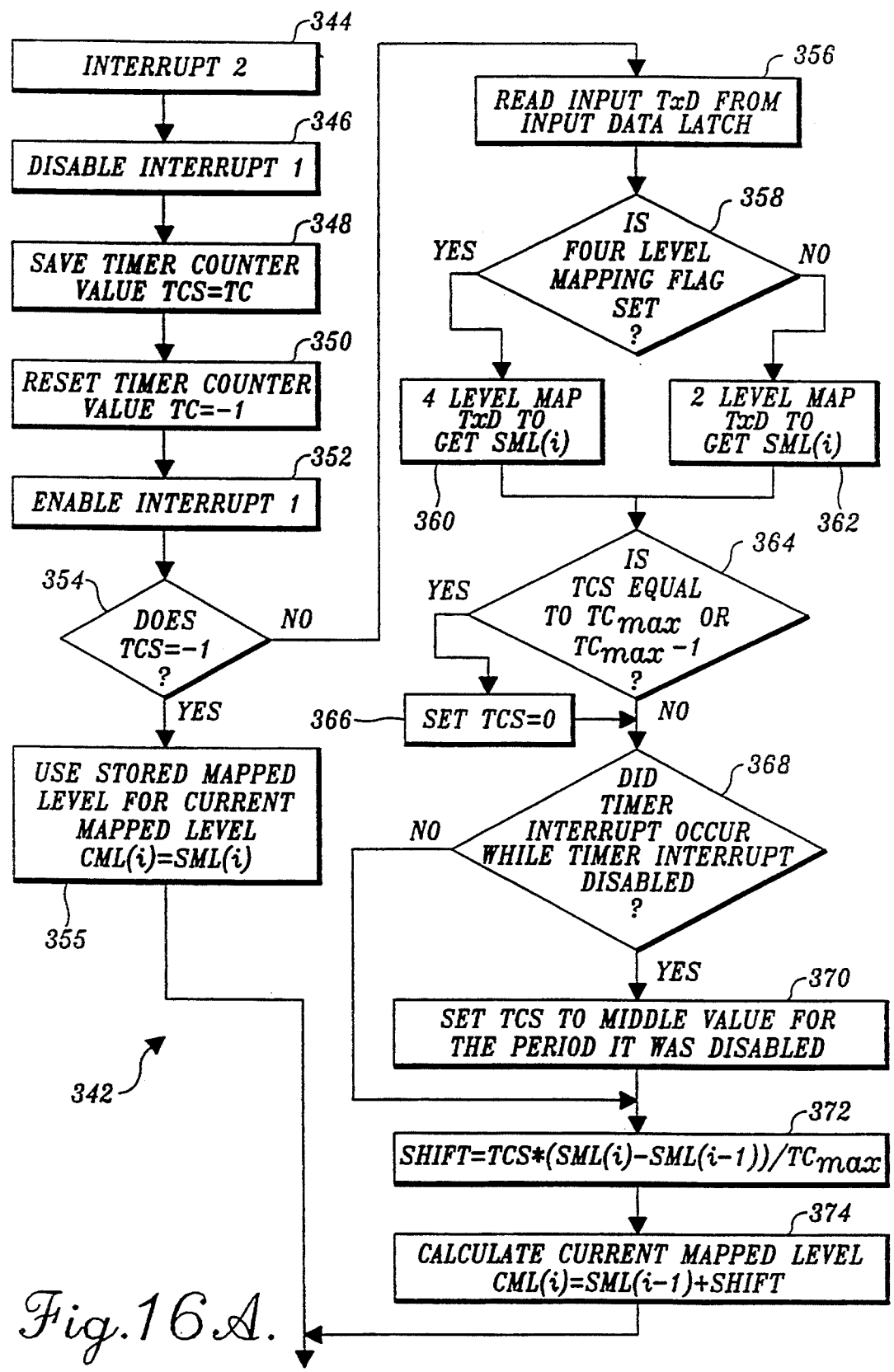
FIGS. 16A and 16B together comprise a flow chart showing the steps for a timer interrupt routine implemented by the signal modulator during operation to modulate a data input signal.
Figure 16B:
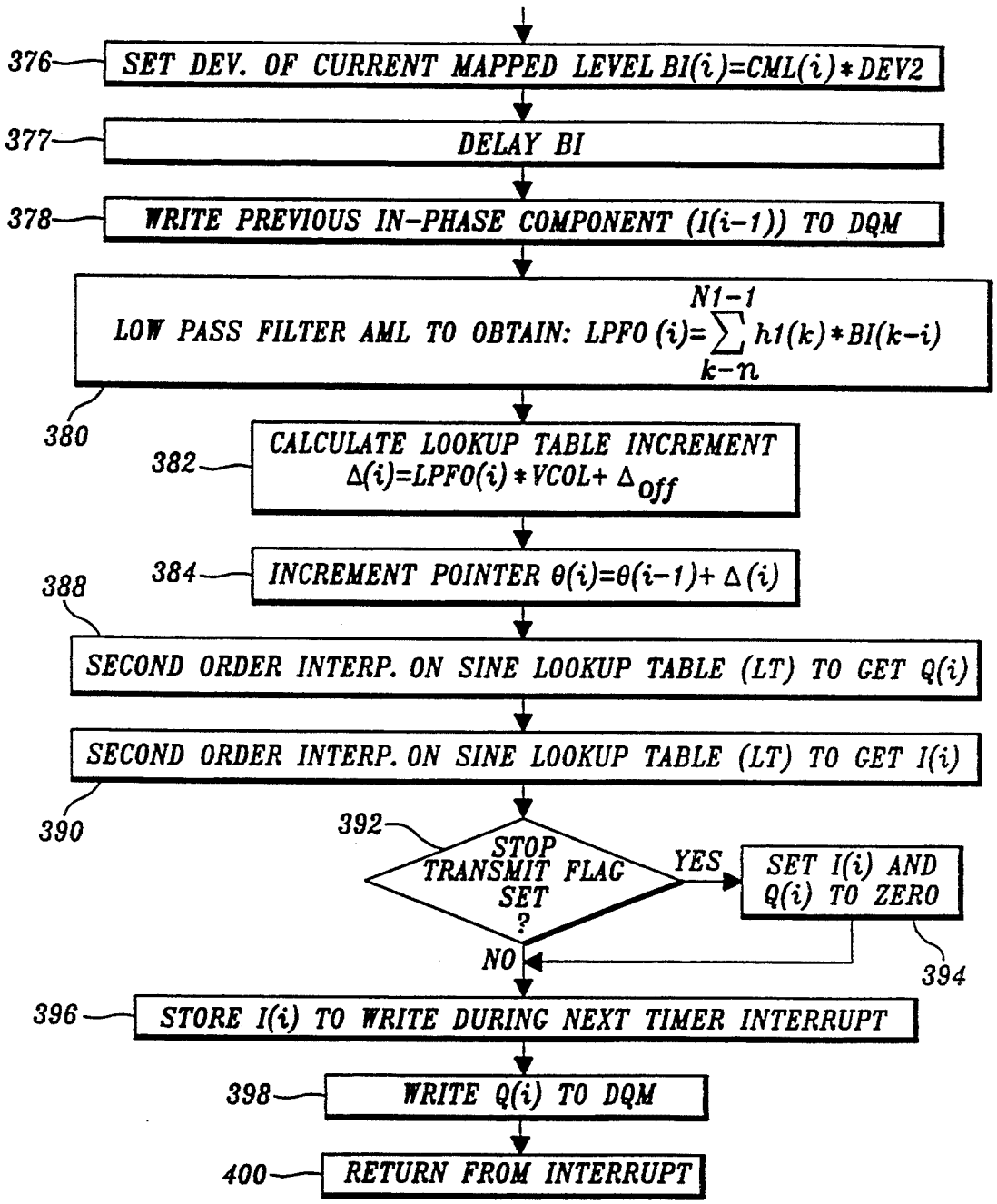

Turning now to FIGS. 16A and 16B, a flow chart 342 discloses the step taken in implementing interrupt 2 during operation in the digital data signal input mode (FM). Interrupt 2 starts at a step 344, which is followed by a step 346 in which interrupt 1 is disabled. A step 348 saves the current timer counter value in a variable TCS (timer counter saved). In a step 350, the value TC is reset to −1. A step 352 enables interrupt 1. In a decision step 354, the logic determines if the value of TCS is equal to −1 and if so, proceeds to a step 355 wherein the stored mapped level (based on previous data samples) for the current mapped level is used. However, if the value of TCS is between 0 and 149 inclusive, the logic proceeds to a step 356 that reads in the input bit stream (T×D) from input latch 88 and maps the value to a level used by the DSP modulation mode that is then active, i.e., FM or linear modulation. A decision step 358 determines if a four level mapping flag has been set (by the operator) and if so, proceeds to a step 360 that four level maps the input bit stream sample(S) to a mapped level SML(i). If operating with two level mapping, a step 362 two level maps the input bit stream sample (S) to obtain the mapped level. Following either step 360 or step 362, a decision step 364 determines if the variable TCS is equal to 148 or 149, and if so, sets TCS equal to 0. This test is necessary because there is a delay of two samples between the time that an edge detect interrupt is received by signal modulator 32 and the time the timer value is stored in TC. If TCS is equal to 148 or 149, the auto reload timer counter has been reset prior to the time that the TCS value was stored, and after the edge detect interrupt signal was generated.

After a step 366 or following a negative response to decision step 364, a decision step 368 determines if a timer interrupt signal was generated while the timer interrupt was disabled, i.e., during the time that the DSP was executing instructions and unavailable to process an edge detect interrupt signal. If so, a step 370 sets TCS to a middle value for the period that the DSP was disabled. Following a negative response to decision step 368 or after step 370 is completed, a step 372 determines a shift value for use in a step 374. Step 374 determines the current mapped level for the input data sample bit stream, interpolated to accommodate asynchronous sampling of the digital input data.

A step 376 sets the frequency deviation of the current mapped level as a function of the frequency deviation variable supplied by the operator, producing a variable BI(i). At this point, the in-phase complex component of the signal modulator for the previous timer interrupt is written to DQM 36. This value, which was previously stored in internal data memory within signal modulator 32, is now output to the DQM in a step 378, the delay in outputting the in-phase value being incurred to provide a temporal spacing between the in-phase and quadrature components of the output signal of at least 25 words, so that the DQM has sufficient time to process both components.

In a step 380, the signal BI(i) that was stored in the internal data buffer is low pass filtered by convolving with the constant coefficients of the FIR filter comprising Bessel LPF 152. These coefficients are represent by h1(k).

A step 382 calculates a lookup table increment for the pointer to the sine lookup table and adds an offset $\Delta_{off}$. Next, a step 384 provides for incrementing the pointer by the value calculated in step 382 to obtain a value for $\theta(i)$, which is in the range 0 to about 128. Seven MSBs of the pointer value represent the integer portion and nine bits represent the fractional portion. A step 386 separates these two portions. The value calculated in step 386 is saved for the next timer interrupt. A step 388 causes the timer routine to perform a second order interpolation, using values of the 128 element sine lookup table. Starting with element m-1, the routine determines the quadrature output component (Q(i)). The pointer is then incremented by 32 and the timer routine performs a second order interpolation using the three values of the 128 element lookup table to determine the in-phase component of the complex signal (I(i)), in a step 390.

A decision step 392 tests the stop transmit flag (controlled by the operator). If set, a step 394 sets I(i) and Q(i), the complex output signal, to 0. Otherwise, a step 396 stores the current value for the in-phase component of the complex signal for use during the next timer interrupt. A step 398 writes the value for the quadrature component (Q(i)) to DQM 36. Thereafter, step 400 returns from the interrupt.

Figure 28:
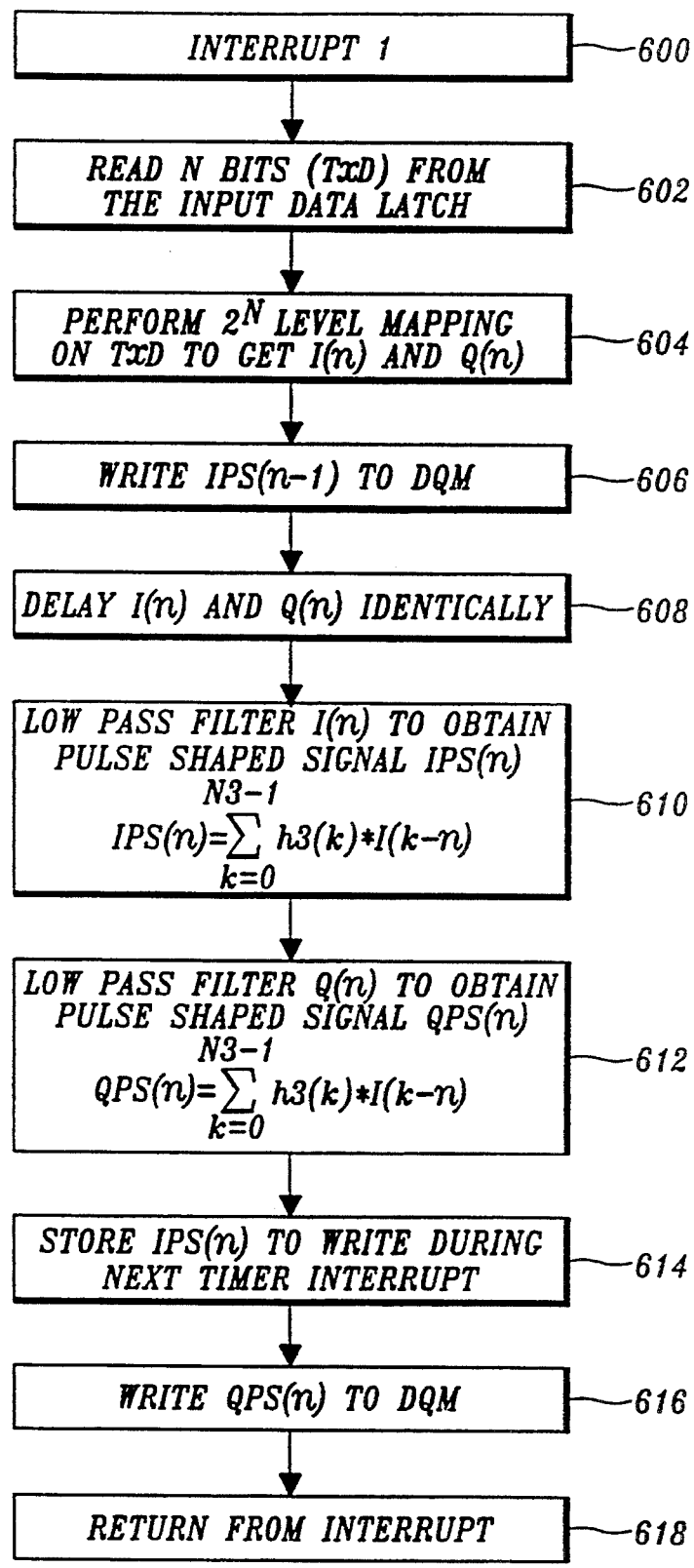
FIG. 28 is a flow chart showing the steps for a timer interrupt routine implemented by the signal modulator during linear modulation of a data input signal.

The steps carded out during linear modulation of a data input signal are illustrated in FIG. 28, starting with an interrupt 1 in a step 600 that occurs at the synchronous input data sample rate. In a step 602, the $2^N$ level mapper reads N bits(T×D) from input data latch 88 and in a step 606 performs the $2^N$ level mapping of T×D to obtain I(n) and Q(n), the in-phase and quadrature components. A step 606 provides for writing a previous pulse shaped value PS(n−1) to DQM 36. The operated selected delay for the linear modulation is applied to both of the complex signals I(n) and Q(n) in a step 608, thereby insuring that the modulated signal produced by exciter 30 will be synchronized with the modulated signals transmitted from other transmitters in a simulcast paging system.

A low pass filter acts on the I(n) component by convolving it with coefficients h3 in a step 610, yielding the pulse shaped signal IPS(n). Similarly, Q(n) is low pass filtered in a step 612 by convolving the signal with coefficients h3, to determine QPS(n). A step 614 temporarily stores IPS(n) so that it can be written to the DQM during the next timer interrupt. In a step 616, QPS(n) is written to DQM 36, and a step 618 then returns from the interrupt.

Figure 17A:
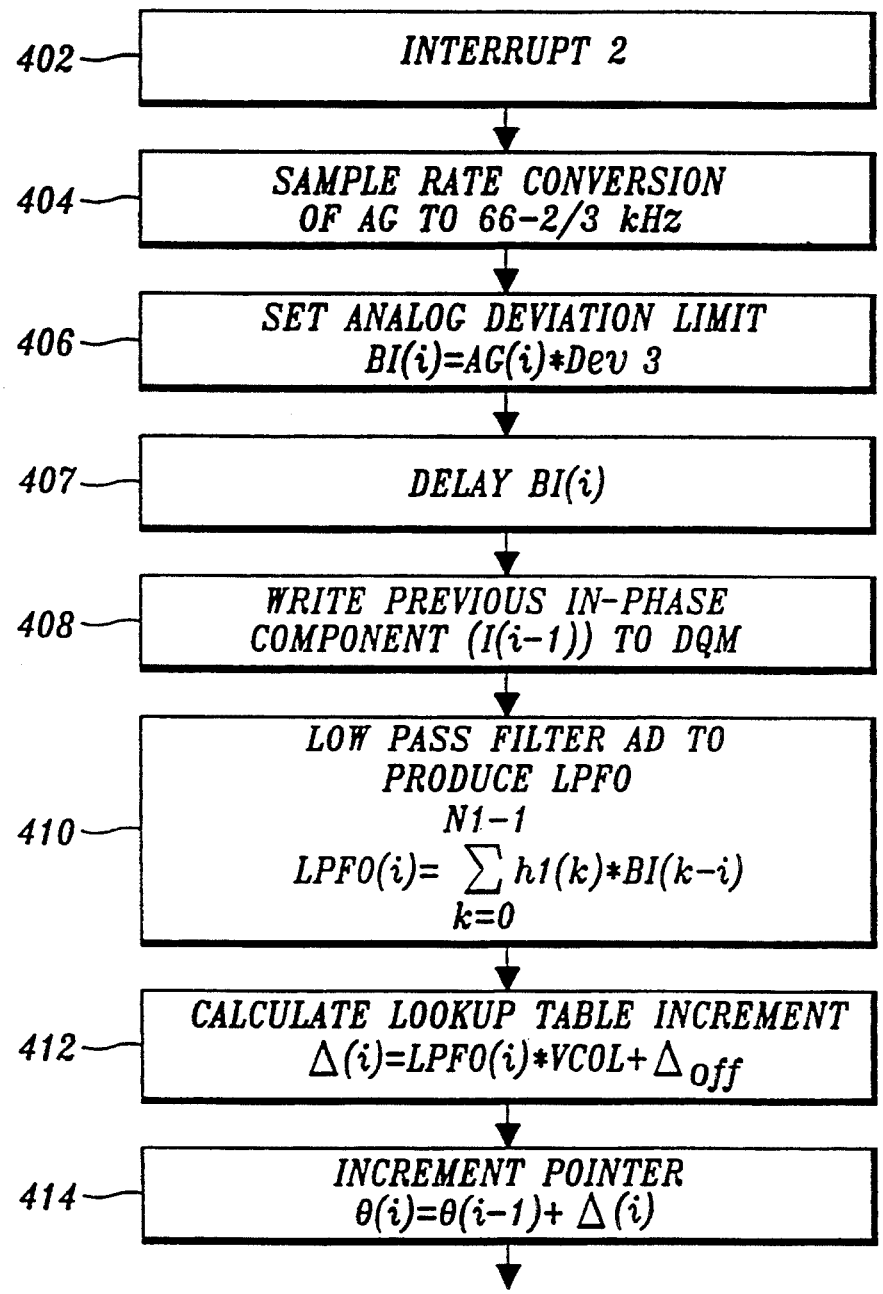
FIGS. 17A and 17B together comprise a flow chart of a timer interrupt routine for operation of the digital exciter in a voice mode.
Figure 17B:
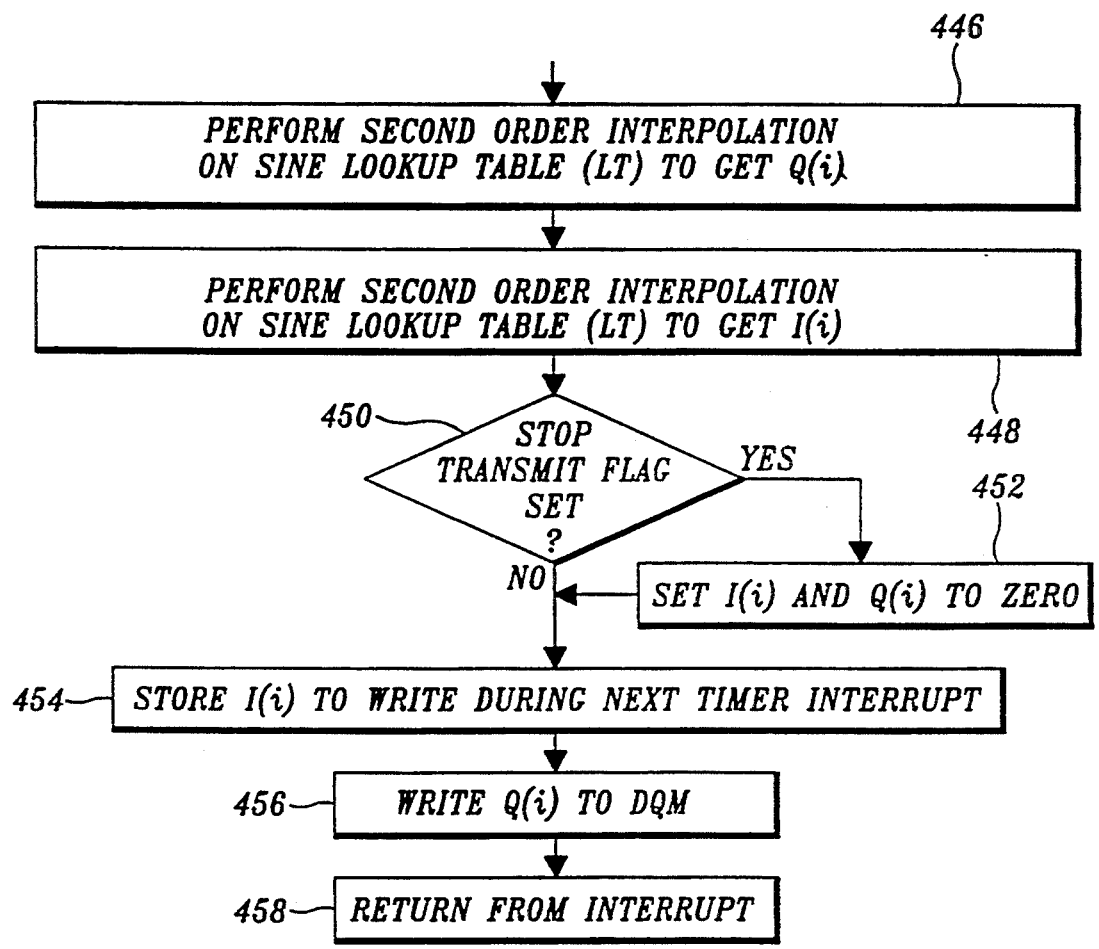

FIGS. 17A and 17B present the steps for the signal modulator interrupt routine 2 when the device is operating to modulate an analog (voice) signal. The timer interrupt routine 2 starts in a step 402 and proceeds to a step 404 that resamples the 9765.625 Hz sample rate signal AG(i) to 66⅔ kHz. Samples from ADC 76 are produced at a 9765.625 Hz rate, and the timer interrupt routine is based upon samples at a 66⅔ kHz rate in the preferred embodiment. A step 406 sets the analog frequency deviation limit as a function of the operator selected value for this variable (used to produce Dev 2), yielding a signal value BI(i). The operator selected delay to be applied to the modulation process is effected in a step 407 by delaying signal BI. In a step 408, the previous in-phase component I(i−1) is written to the DQM through interpolator 38. A low pass filtering process is applied to the values BI(i) by convolving them with coefficients h1, producing a low pass filtered signal LPFO(i).

In a step 412, a cosine/sine lookup table increment A(i) is determined as a function of LPFO(i), a variable VCOL and an offset $\Delta_{off}$. The lookup table pointer is incremented in a step 414, to determine a new pointer value $\theta(i)$. The remaining steps 446 through 458 are the same as steps 388 through 400, carried out in connection with modulating digital input data. Consequently, these steps need not be again discussed.

Figure 18:
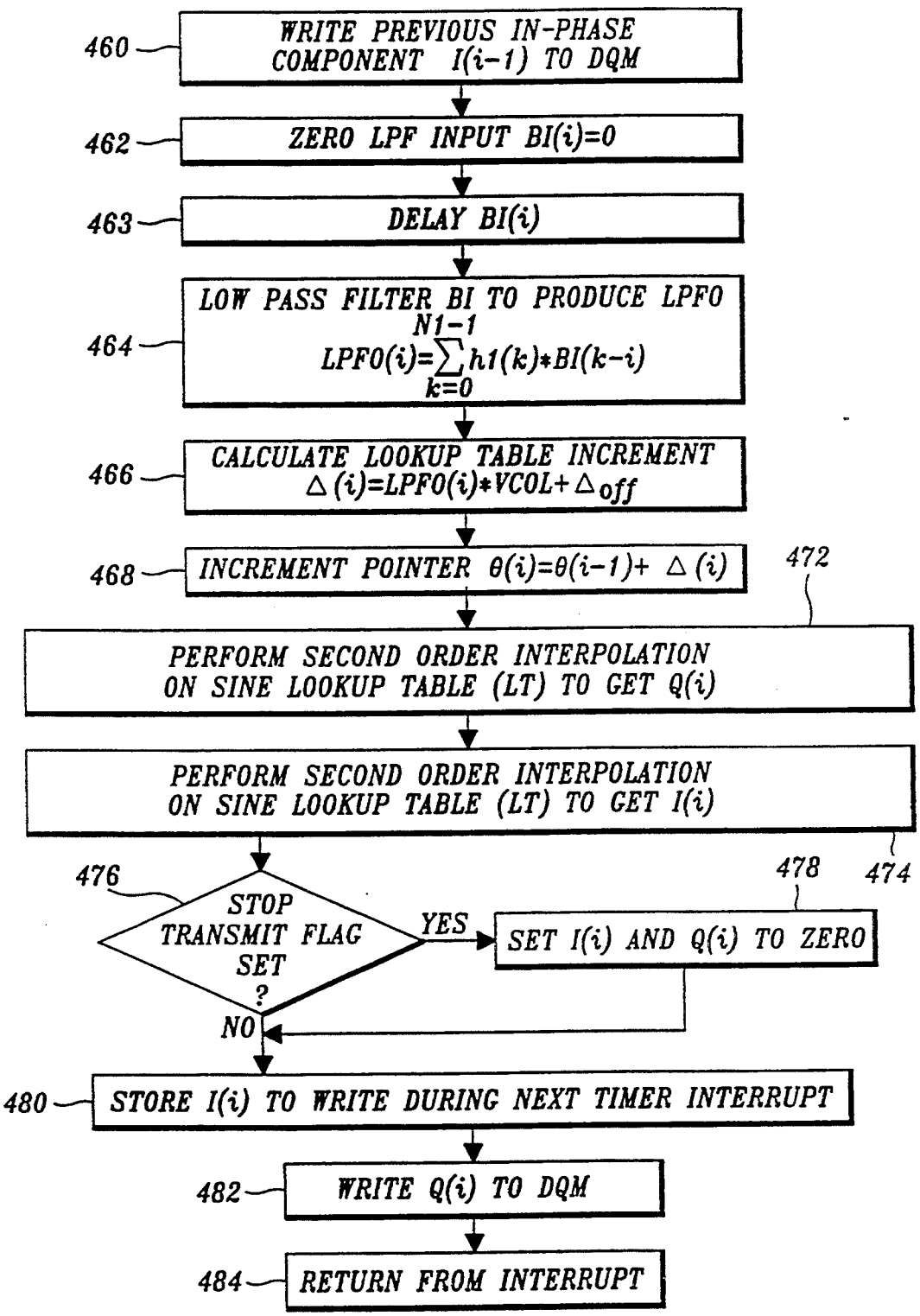
FIG. 18 is a flow chart for a signal modulator timer interrupt routine during a mode change.

If digital exciter 30 receives a command to change modes from controller 40, a mode change task carried out in a background routine changes a jump address at the start of the timer interrupt to change to a switch over timer interrupt routine, which is shown in FIG. 18. This routine starts at a step 460, wherein a previous in-phase component I(i−1) is written to DQM 36. Step 460 is necessary because the timer interrupt routine operates at a 66⅔ kHz rate at all times and the signal modulator has no way of stopping the operation of the DQM. Failure to send in-phase and quadrature components to the DQM as it expects would cause signal modulator 32 and DQM 36 to lose synchronization with each other. In switch over interrupt routine 2, provision is made for sending the in-phase and quadrature components of the complex signal to the DQM at the required 66⅔ kHz rate, while the mode select subroutine carries out variable initializations necessary for mode change over. Once these initializations are completed in the background program, the mode select subroutine changes the jump address at the start of the timer interrupt to the start address for operation of the digital exciter in modulating either digital or analog (voice) input data.

The final stages of processing are identical for both analog and digital data, following a zeroing of the LPF input in a step 462 and a delay of the signal BI for the operator selected interval in a step 463. Thus, steps 464 through 484 are the same as steps 380 through 400 in FIG. 16, which were discussed above.

Figure 19:
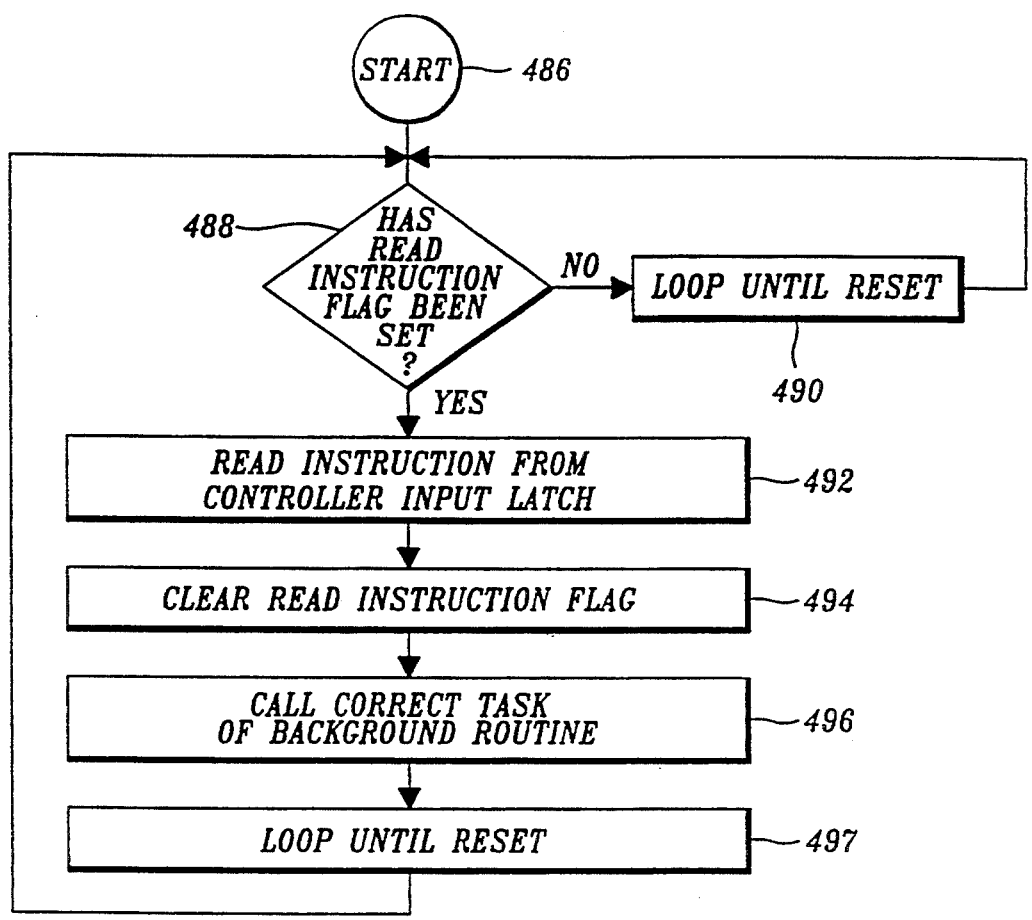
FIG. 19 is a flow chart showing the logical steps implemented during the background operation of the signal modulator DSP.

A background routine illustrated in FIG. 19 executes whenever an interrupt routine is not being executed by signal modulator 32. The background routine is also pre-empted if any interrupt occurs while the background routine is processing, and the routine continuously polls the data available DSP flag bit on the 8-bit input latch 70 until that bit is set. Once the bit is set, signal processor 32 knows that an instruction from control 40 has been written to the 16-bit latch, causing the background routine to read the instruction and clear the data available DSP flag.

There are four tasks that the background routine implements, including a software reset, a change in mode of operation, a change in the value of any of the parameters discussed above, or a request for the signal modulator to provide the status of a parameter. The background routine jumps to the start address for the specific task involved and once it has finished the task, returns to a loop where it scans the data available DSP flag bit. This procedure is set forth in FIG. 19, beginning at a start step 486. A decision step 488 determines if the read instruction flag has been set, and if not, proceeds to step 490 that causes the DSP to loop until the flag bit has been set. Otherwise, the logic proceeds to a step 492 that provides for reading the instruction from the 16-bit input latch 70. A step 494 clears the read instruction flag, and a step 496 calls the appropriate task to be implemented by the background routine. Thereafter, the routine loops until reset.

Figure 20:
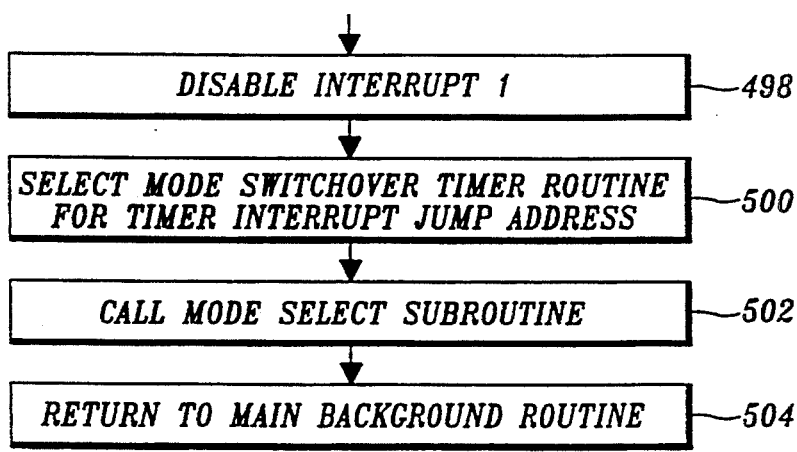
FIG. 20 is a flow chart of the a mode change task run in the background.

In FIG. 20, a background routine for implementing a mode change task is illustrated, beginning at a step 498 that disables interrupt 1. A step 500 then selects the mode switch over timer routine and selects the timer interrupt jump address as described above. The appropriate mode select subroutine is called in a step 502. After implementing the mode select subroutine, the logic returns to the main background routine in a step 504.

Control 40 can set any one of eight parameters in the preferred embodiment, including: the frequency offset of the digital exciter when operating with data input, the frequency offset of the digital exciter when operating with analog input, the VCO deviation limit, the frequency deviation of the digital exciter when operating with data input, the frequency deviation of the exciter when operating with an analog input, the frequency deviation of the digital exciter when operating with an analog input, the polarity of the digital data mapping, and interruption of the output signal from VCO 156 (logic switch 228).

Figure 21:
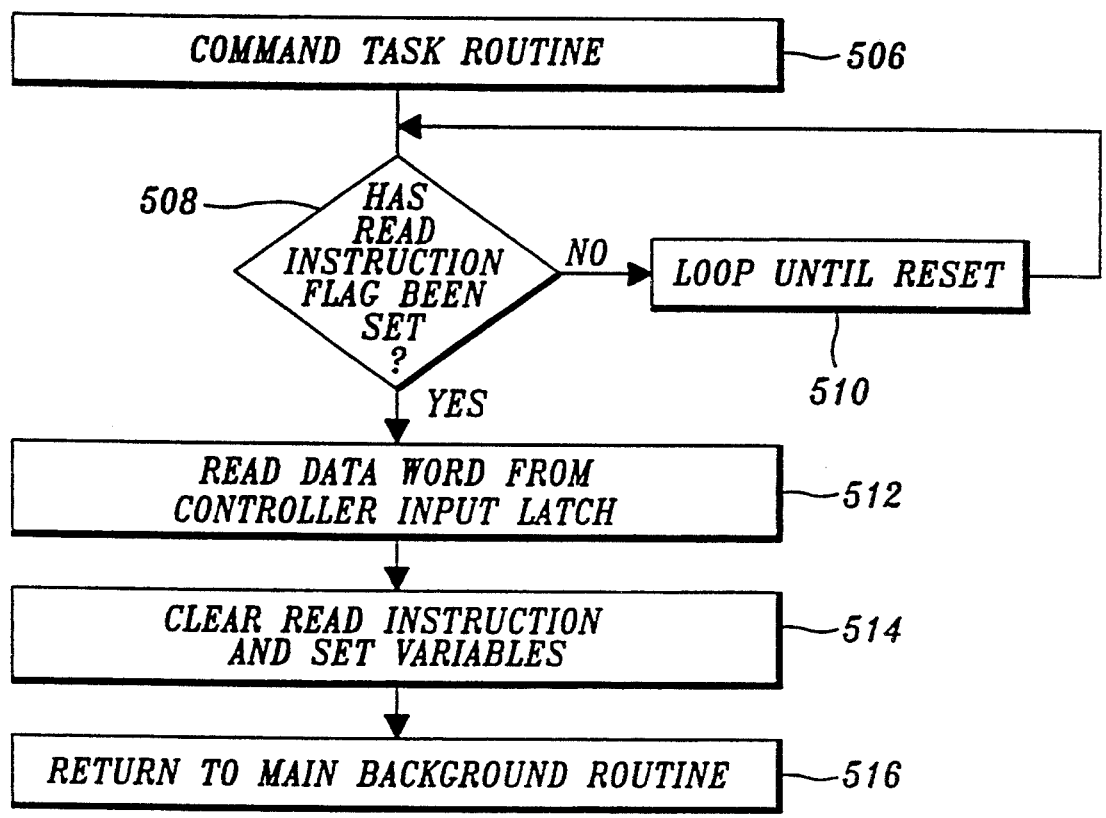
FIG. 21 is a flow chart illustrating the steps for setting offset, and frequency deviation in response to operator selection of one of these parameters.
Figure 22:
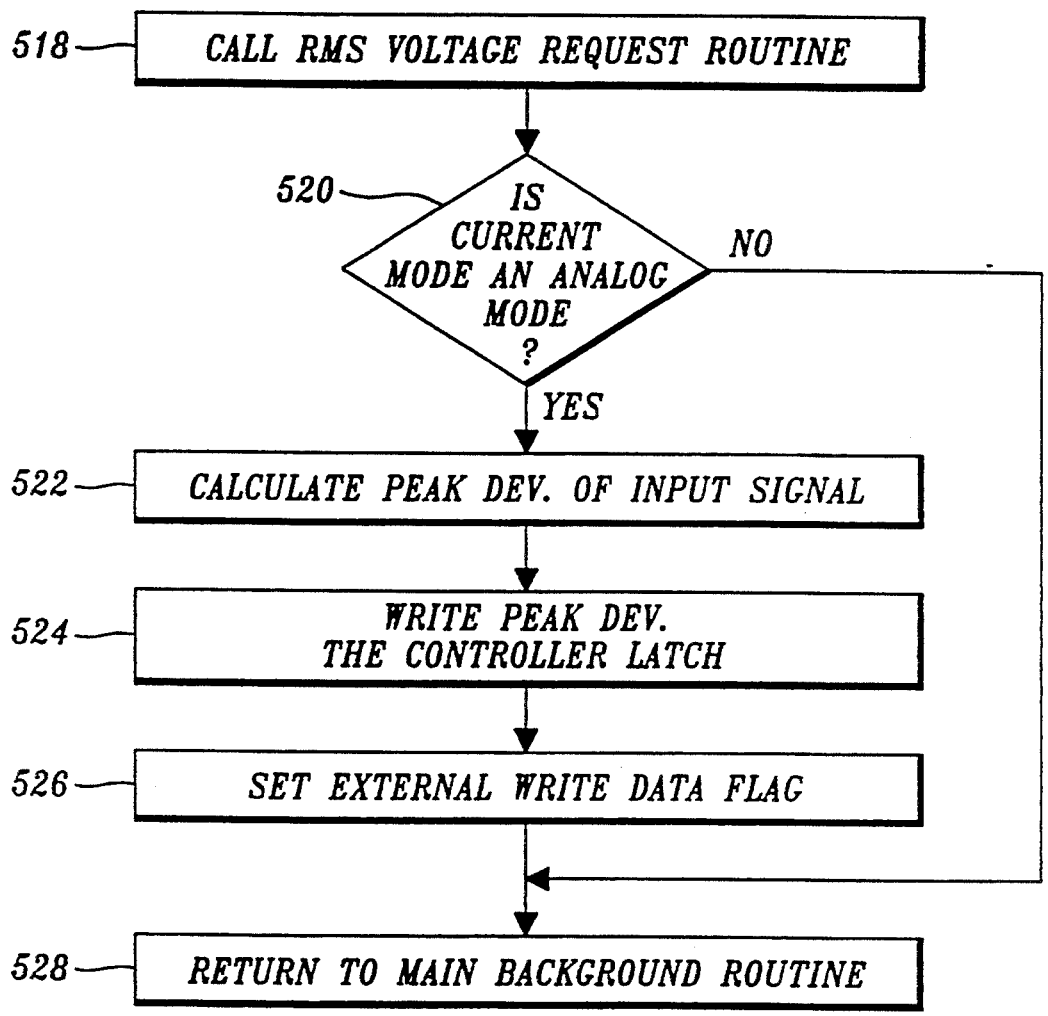
FIG. 22 is a flow chart defining the steps for determining the peak frequency deviation of the signal being modulated.

FIGS. 21 and 22 respectively cover the background routines for setting the offsets, deviations, or adjusting frequency deviation, or, the operation to report the peak frequency deviation in response to a status request. In FIG. 21, a step 506 is an entry point to the appropriate command task routine. A decision step 508 determines if the read instruction flag has been set (by control 40) and if not, a step 510 causes the logic to loop until the flag is reset. However, if the flag is set, a step 512 reads the data word from latch 70 and adjusts the selected variables. A step 514 then clears the read instruction and set the variables. Thereafter, a step 516 returns to the main background routine.

Similarly, in FIG. 22, a step 518 indicates that a peak deviation routine is to be implemented wherein the signal modulator determines the peak frequency deviation of the sampled input signal. A decision step 520 determines whether the signal modulator is operating with analog data and if not, proceeds to a step 528 that returns to the main background routine. However, if operating in the analog mode, a step 522 calculates the peak frequency deviation of the input signal. The peak frequency deviation is then written to the 16-bit latch of latches 70 in a step 524, and an external write data flag in the 8-bit latch is set in a step 526. Again, a step 528 subsequently returns the signal modulator to the main background routine.

Figure 23:
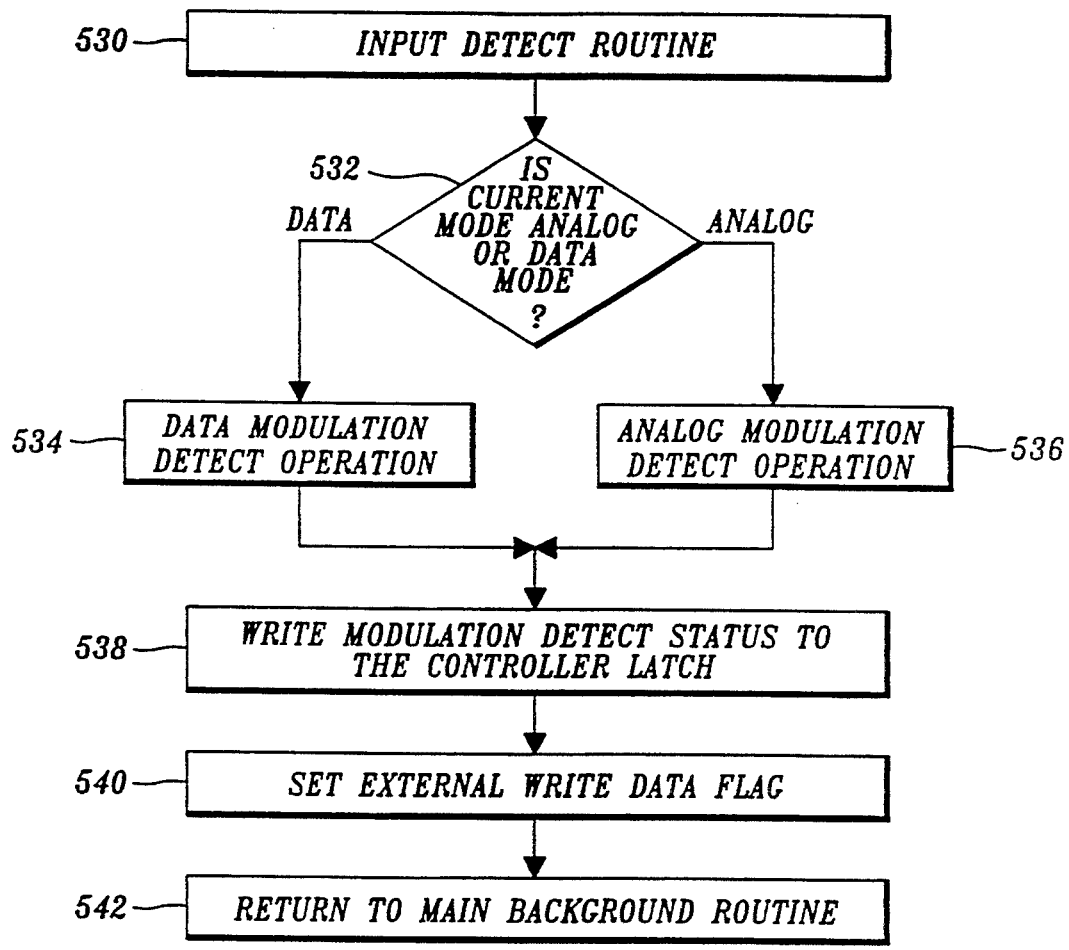
FIG. 23 is a flow chart illustrating the logical steps for determining whether an input signal to the digital exciter is present.

Another status request task is detecting whether or not an input signal is active. FIG. 23 shows the background routine implemented when a step 530 calls the modulation detect status request routine. A decision step 532 determines if the digital exciter is operating with analog or digital input data. If with digital data, a step 534 determines if edge transitions are occurring in the data timer routine, which if so, indicates that modulation is occurring. Conversely, if operating with analog data, a step 536 checks the amplitude of the input to determine if it ever exceeds a threshold during a predefined period of time, which only occurs if an input analog signal is present. Subsequently, a step 538 writes a modulation detect status flag to latches 70 and sets the external write data flag to the latches in a step 540, before returning to the main background routine in a step 542.

Figure 24:
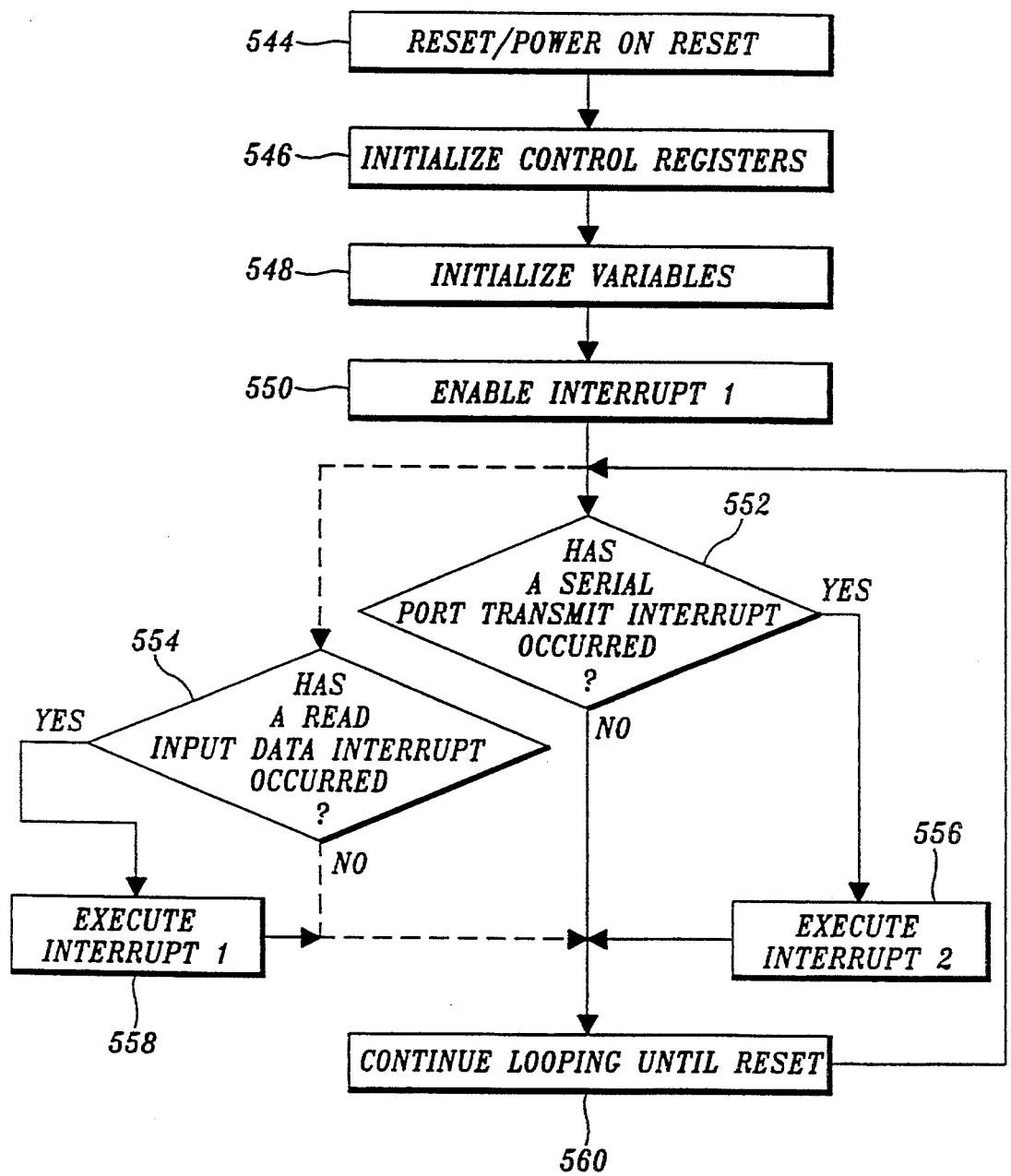
FIG. 24 is a flow chart defining the steps implemented by the DQM.
Figure 25:
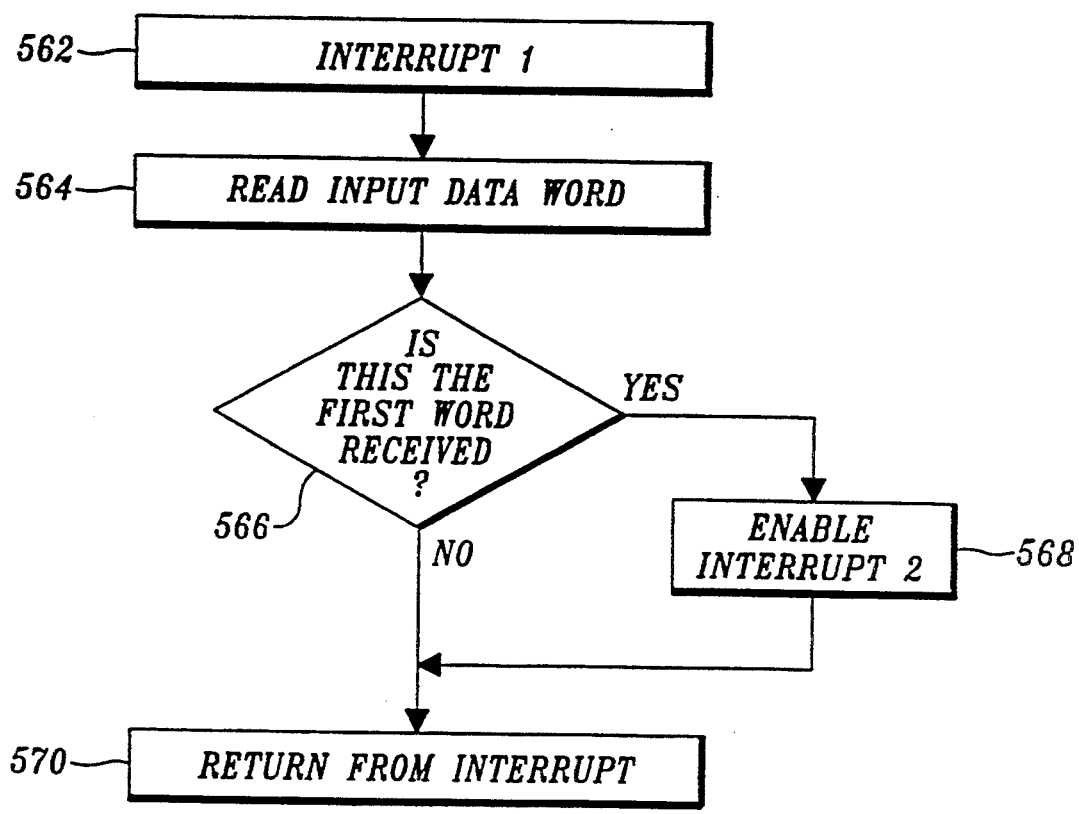
FIG. 25 is a flow chart showing the logical during a read data input operation by the DQM.
Figure 26:
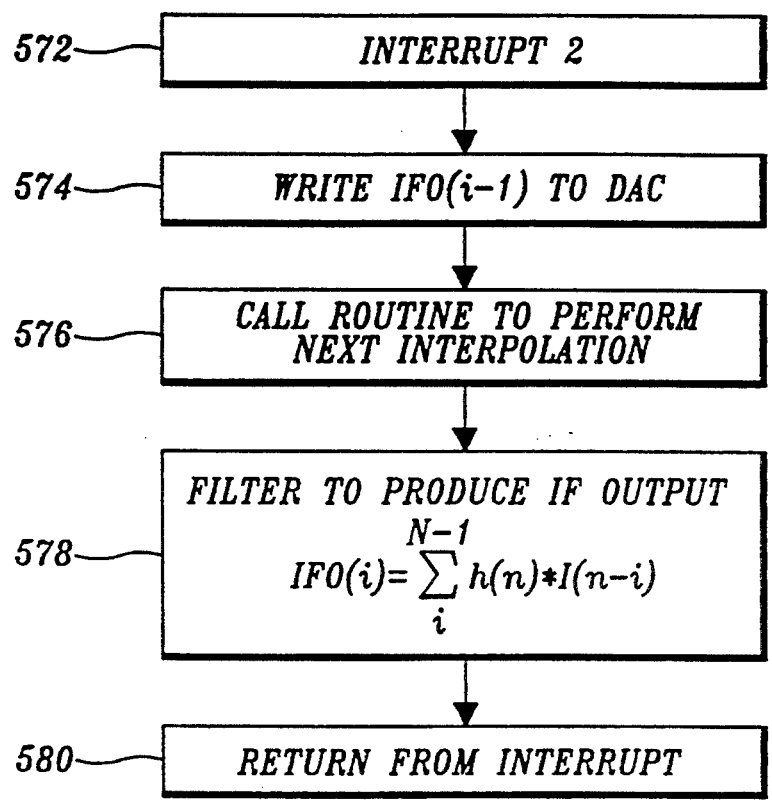
FIG. 26 is a flow chart showing the serial port interrupt routine for the DQM.

FIGS. 24 through 26 cover various aspects of the operation of DQM 36. In FIG. 24, the steps implemented by the reset routine for DQM 36 are illustrated, beginning at a step 544 that occurs upon reset or power on of digital exciter 30. Following such a reset, a step 546 initializes the control registers and a step 548 initializes variables used by DSP 34. In a step 550, interrupt 1 is enabled. The DQM then enters a loop waiting for interrupts to occur, until reset. In a decision step 552, it determines whether or not a serial port transmit interrupt has occurred (interrupt 2), which occurs at a rate of 400 kHz. If not, the logic continues with a step 560 to loop back to decision step 552; this loop continues until the device is reset. However, if the response to decision step 552 is positive, a step 556 executes interrupt 2 and thereafter proceeds to step 560. At any point, if a read input data interrupt occurs (interrupt 1), the occurrence is detected by decision step 554. If so, a step 558 executes interrupt 1. Otherwise, the response from decision step 554 continues with step 560, looping until reset.

FIG. 28 illustrates the steps carried out in implementing interrupt 1 at a step 562. During a step 564, the interrupt 1 routine reads in the data word from the external latch. A decision step 566 determines if this is the first word written to it from the signal modulator. If so, a step 568 enables interrupt 2. Otherwise, or after step 568, the logic proceeds to a step 570, returning from the interrupt. FIG. 26 illustrates the steps implemented during interrupt 2 at a step 572. Following the interrupt, the routine first writes a previous DQM first intermediate frequency output IFO(i−1) to a serial port transmit register so that it can be sent to DAC 110 in a step 574. In a step 576, a routine is called to perform the next interpolation. Samples of either the in-phase or quadrature signals are convolved in a step 578 through one of 12 possible FIR interpolation filters. By cycling through the 12 filters, the two operations, including interpolation by a factor of six from 66⅔ kHz to 400 kHz and modulation to produce the IF output signal at 100 kHz, are performed simultaneously. The interrupt routine alternates between filtering in-phase and quadrature components in this manner and returns from the interrupt at a step 580.

While the preferred embodiment of the invention has been illustrated and described with respect to the preferred embodiment, it will be appreciated that various changes can be made therein without departing from the spirit and scope of the invention. Accordingly, the scope of the invention is not to be limited by the description of the preferred embodiment, but instead should be determined entirely by reference to the claims that follow.

The embodiments of the invention in which an exclusive property or privilege is claimed are defined as follows:

1. An exciter for a radio transmitter, comprising:
   (a) means for supplying an input signal to the exciter for processing and transmission as a radio signal;

(b) input signal modulating means, coupled to the means for supplying the input signal, for modulating the input signal and producing a modulated signal that is complex, having both in-phase and quadrature components, said input signal modulating means including a digital voltage controlled oscillator that comprises a first digital signal processor, said first digital signal processor producing the in-phase and quadrature components by processing the input signal with quadrature related periodic functions;

(c) interpolating means, coupled to the input signal modulating means to receive the modulated signal, for sampling the modulated signal to produce sampled values and interpolating between the sampled values of the modulated signal to determine interpolated values intermediate the sampled values, thereby increasing an effective sample rate at which the modulated signal is sampled, the sampled and interpolated values together comprising an interpolated signal;

(d) quadrature modulating means, coupled to the interpolating means to receive the interpolated signal, for converting the interpolated signal from a complex signal to a pass band signal that is not complex; and (e) up converting means, coupled to the quadrature modulating means to receive the pass band signal, for converting the pass band signal from a lower frequency signal to a higher frequency signal for output and transmission as the radio signal.

2. The exciter of claim 1, wherein the up converting means comprise:

(a) a digital-to-analog converter that receives the pass band signal and converts it from a digital signal to an analog signal;

(b) a first local oscillator that produces a first periodically varying signal having a frequency higher that of the pass band signal;

(c) a first multiplier that multiplies the first periodically varying signal by the analog signal to produce a first intermediate frequency signal;

(d) a band pass filter that filters the first intermediate frequency signal to produce a filtered signal;

(e) a second local oscillator that produces a second periodically varying signal having a frequency higher than that of the filtered signal; and (f) a second multiplier that multiplies the second periodically varying signal by the filtered signal to produce a second intermediate frequency signal, which comprises the output signal.

3. The exciter of claim 1, wherein the interpolating means and the quadrature modulating means comprise a second digital processor.

4. The exciter of claim 1, wherein the input signal modulating means further include a low pass filter coupled to receive and filter the input signal before the input signal is supplied to the digital voltage controller oscillator.

5. The exciter of claim 1, wherein the first digital signal processor includes memory in which a lookup table of a limited number of values for the periodic functions are stored, said first digital signal processor interpolating values for the periodic functions intermediate those that are stored in the lookup table to improve the resolution with which the values of the periodic functions used to determine the quadrature and in-phase components are defined.

6. The exciter of claim 5, wherein the first digital signal processor interpolates values of the periodic functions a second order interpolation.

7. The exciter of claim 1, wherein the quadrature modulating means include complex multiplying means that operate at a frequency selected so that the quadrature modulation can be implemented by multiplying the interpolated signal by sine and cosine functions having integer values.

8. The exciter of claim 1, wherein the means for supplying the input signal comprise an edge detector that produces an edge detect signal when a data input signal changes logical state, and wherein the input signal modulating means include a timer responsive to the edge detect signal, said timer determining a time interval between when the input signal was last sampled at a predefined sample rate and the time at which the edge detect signal is produced, said input signal modulating means including filtering means to scale samples of the input signal based on the time interval to determine data transitions that are synchronous with changes in the logical state of the data input signal.

9. The exciter of claim 8, wherein the filtering means comprise a finite impulse response low pass filter.

10. The exciter of claim 1, wherein the input signal modulating means comprise frequency shifting means for adjusting a center frequency of the complex signal by a variable increment.

11. The exciter of claim 1, wherein the input signal modulating means include modulation selecting means that enable operator selection of one of a linear modulation and a frequency modulation of the input signal.

12. A method for using an input signal to modulate a radio frequency output signal for transmission, comprising the steps of:

(a) processing the input signal with quadrature related periodic functions using a digital signal processor, to produce a digital complex signal having both in-phase and quadrature components;

(b) sampling the digital complex signal to produce sampled values;

(c) interpolating between the sampled values of the digital complex signal to determine interpolated values intermediate the sampled values, thereby increasing an effective sample rate at which the digital complex signal is sampled, sampled and interpolated values together comprising an interpolated signal;

(d) convening the interpolated signal from a complex signal to a pass band signal that is not complex; and (e) converting the pass band signal from a lower frequency signal to a higher frequency signal for output and transmission as a modulated radio signal.

13. The method of claim 12, wherein the step of converting the pass band signal comprises the steps of:

(a) converting the pass band signal from a digital signal to an analog signal;

(b) producing a first periodically varying signal having a frequency higher than that of the pass band signal;

(c) multiplying the first periodically varying signal by the analog signal to produce a first intermediate frequency signal;

(d) band pass filtering the first intermediate frequency signal to produce a filtered signal;

(e) producing a second periodically varying signal having a frequency higher than that of the filtered signal; and (f) multiplying the second periodically varying signal by the filtered signal to produce a second intermediate frequency signal, which comprises the output signal.

14. The method of claim 12, wherein the step of processing the input signal further comprises the step of low pass filtering the input signal to produce a filtered input signal that is then processed with the quadrature related periodic functions.

15. The method of claim 14, wherein the step of processing the input signal further comprises the steps of:
(a) storing a limited number of values for the periodic functions in a lookup table;
(b) interpolating values for the periodic functions intermediate those that are stored in the lookup table to improve the resolution with which the values of the periodic functions used to define the in-phase and quadrature components are determined.

16. The method of claim 12, further comprising the step of converting the in-phase and quadrature components from digital signals to analog signals, after step (d) and before step (e).

17. The method of claim 12, wherein the input signal is a digital signal, further comprising the steps of:
(a) producing an edge detect signal when the input signal changes logical state;
(b) sampling the input signal at a predefined sample rate;
(c) determining a time interval between when the input signal was last sampled at the predefined sample rate and the time at which the edge detect signal was produced; and
(d) scaling samples of the input signal based on the time interval to determine data transitions that are synchronous with changes in the logical state of the data input signal.

18. The method of claim 12, further comprising the step of adjusting a center frequency of the digital complex signal by a variable increment.

19. The method of claim 12, wherein the step of processing comprises the step of selecting one of a linear modulation and a frequency modulation of the input signal.

20. In an exciter for a radio transmitter, apparatus for selectively setting and adjusting a characteristic parameter used in modulating a radio frequency signal produced by the exciter, without the need for monitoring the radio frequency signal to determine the effect of such adjustment, said apparatus comprising:
(a) digital signal processor means, coupled to receive an input signal, for producing a complex modulated signal in which the input signal determines a modulated condition according to a selected modulation scheme;
(b) processor control means, coupled to the digital signal processor means, for controlling the digital signal processor means according to a set of predefined program instructions, said processor control means using an operator selected digital value for said characteristic parameter to control the digital signal processor means; and
(c) operator interface means, coupled to the processor control means, for accepting an operator selection of the digital value for said characteristic parameter, said processor control means thereby supplying the digital signal processor means with said digital value for use in producing the complex modulated signal and thus eliminating any drift or variation in said characteristic parameter with time and as a function of changes in ambient conditions that might otherwise result from an analog adjustment of said characteristic parameter.

21. The apparatus of claim 20, wherein the characteristic parameter comprises one or more parameters selected from a group that includes: a frequency deviation limit for a frequency shift keying modulation, an exciter center frequency, an analog frequency deviation limit, an analog frequency deviation level, a frequency shift keying frequency deviation level, an analog signal modulation delay, and a digital signal modulation delay.

22. The apparatus of claim 20, wherein the operator interface means comprise a remote terminal that is coupled to the processor control means from a different geographical location than that where the processor control means are disposed, said remote terminal enabling an operator at the different geographical location to select the characteristic parameter.

23. The apparatus of claim 20, wherein the operator interface means comprise a key panel and a display, the key panel including a plurality of discrete switches selectively actuated by the operator to select the digital value for said characteristic parameter.

24. The apparatus of claim 20, wherein the processor control means monitor the modulation condition, producing a signal indicative of said modulation condition, said operator interface means displaying a value corresponding to the signal to an operator.

25. The apparatus of claim 24, wherein the signal indicative of the modulation condition is selected by the operator from among a group of signals that include: an input data detection signal, a modulation mode signal, a frequency deviation limit signal for frequency shift keying modulation, an analog peak frequency deviation signal, an analog frequency deviation level signal, a frequency shift keying frequency deviation level signal, an analog signal delay signal indicative of a delay applied to the modulation of an analog input signal, a digital delay signal indicative of a delay applied to the modulation of a digital signal, and a center frequency offset signal.

26. The apparatus of claim 24, wherein the operator interface means comprise a remote terminal that is coupled to the processor control means from a different geographical location than that where the processor control means are disposed, said remote terminal enabling an operator at the different geographical location to access the signal indicative of the modulation condition and to select from among a group of such signals, said group including: an input data detection signal, a modulation mode signal, a frequency deviation limit signal for frequency shift keying modulation, an analog peak frequency deviation signal, an analog frequency deviation level signal, a frequency shift keying frequency deviation level signal, an analog signal delay signal indicative of a delay applied to the modulation of an analog input signal, a digital delay signal indicative of a delay applied to the modulation of a digital signal, and a center frequency offset signal.

27. The apparatus of claim 20, wherein the digital signal processor means includes a selectable pre-emphasis filter, said processor control means responding to an operator input to cause the digital signal processor means to selectively use the pre-emphasis filter when producing the complex modulated signal.

28. A method for selectively setting and adjusting a characteristic parameter used by an exciter in a radio transmitter for modulating a radio frequency signal, without the need for monitoring the radio frequency signal to determine the effect of such adjustment, said method comprising the steps of:
  (a) producing a complex modulated signal having both in-phase and quadrature components, the input signal being used in modulating the complex modulated signal to produce the radio frequency signal, according to a selected modulation scheme;
  (b) accepting an operator selection of a digital value for said characteristic parameter; and
  (c) using said digital value selected by the operator in producing the complex modulated signal, so that drift and variations in said characteristic parameter with time and as a function of changes in ambient conditions, as might otherwise have occurred when an analog adjustment and setting for said characteristic parameter had otherwise been used, are eliminated.

29. The method of claim 28, wherein the step of accepting an operator selection comprises the step of the operator selecting the characteristic parameter from among a group that includes: a frequency deviation limit for a frequency shift keying modulation, an exciter center frequency, an analog frequency deviation limit, an analog frequency deviation level, a frequency shift keying frequency deviation level, an analog signal modulation delay, and a digital signal modulation delay.

30. The method of claim 28, wherein the step of accepting the operator selection of the digital value includes the step of transmitting the digital value selected by the operator from a different geographic location than that where the radio frequency signal is being modulated.

31. The method of claim 28, wherein the step of accepting the operator selection of the digital value includes the step of selecting the digital value by entering the digital value on a key pad.

32. The method of claim 28, further comprising the steps of:
  (a) producing a signal indicative of the modulation condition of the RF signal; and
  (b) displaying a value corresponding to said signal to the operator.

33. The method of claim 32, further comprising the step of selecting the signal indicative of the modulation condition from a group of signals that include: an input data detection signal, a modulation mode signal, a frequency deviation limit signal for frequency shift keying modulation, an analog peak frequency deviation signal, an analog frequency deviation level signal, a frequency shift keying frequency deviation level signal, an analog signal delay signal indicative of a delay applied to the modulation of an analog input signal, a digital delay signal indicative of a delay applied to the modulation of a digital signal, and a center frequency offset signal.

34. The method of claim 32, wherein said steps of producing the signal and displaying the value are responsive to an operator disposed a geographically remote location, enabling that operator to access the signal as it is displayed at the remote location.

35. The method of claim 28, further comprising the step of selectively using a pre-emphasis filter in modulating the RF signal.

36. The method of claim 28, further comprising the step of selecting a mode for modulating the radio frequency signal, said mode thus selected including one of a data mode in which modulation of the radio frequency signal with a digital input data signal occurs, and an analog mode in which modulation of the radio frequency signal with an analog input data signal occurs.

37. An exciter for a radio transmitter in a simulcast radio system comprising a plurality of transmitters that transmit a common signal at about the same time comprising:
  (a) digital signal processor means, coupled to receive an input signal, for producing a complex modulated signal in which a carrier signal is modulated by the input signal, thereby producing a modulated signal;
  (b) delay means for delaying a signal that is being modulated by the digital signal processor means, for a selected interval of time; and
  (c) means for operator entry of the selected interval of time used by the delay means, said selected interval of time being selected by an operator so that the delay means delay the signal being modulated by the digital signal processor means sufficiently to synchronize the modulated signal with corresponding modulated signals produced by other transmitters in the simulcast radio system.

38. In an exciter for a radio transmitter used in a simulcast radio system that include a plurality of transmitters, a method for synchronizing a signal transmitted from the radio transmitter with corresponding signals transmitted from other transmitters in the simulcast radio system, comprising the steps of:
  (a) producing a complex modulated signal in a digital exciter in which a carrier signal is modulated by an input signal;
  (b) entering a delay time into the digital exciter, a duration of said delay time being selected so as to synchronize the complex modulated signal with corresponding modulated signals transmitted from other transmitters in the simulcast radio system; and
  (c) at a point integral with the digital exciter, delaying a signal that is being modulated, for the delay time.

39. An exciter for a radio transmitter, comprising:
  (a) means for supplying an input signal to the exciter for processing and transmission as a radio signal, said means for supplying the input signal including an edge detector that produces an edge detect signal when a data input signal changes logical state;
  (b) input signal modulating means, coupled to the means for supplying the input signal, for modulating the input signal and producing a modulated signal that is complex, having both in-phase and quadrature components and wherein the input signal modulating means include a timer responsive to the edge detect signal, said timer determining a time interval between when the input signal was last sampled at a predefined sample rate and the time at which the edge detect signal is produced;
  (c) interpolating means, coupled to the input signal modulating means to receive the modulated signal, for sampling the modulated signal to produce sampled values and interpolating between the sampled values of the modulated signal to determine interpolated values intermediate the sampled values, thereby increasing an effective sample rate at which the modulated signal is sampled, the sampled and interpolated values together comprising an interpolated signal;

(d) quadrature modulating means, coupled to the interpolating means to receive the interpolated signal, for converting the interpolated signal from a complex signal to a pass band signal that is not complex; and (e) up converting means, coupled to the quadrature modulating means to receive the pass band signal, for converting the pass band signal from a lower frequency signal to a higher frequency signal for output and transmission as the radio signal.

40. The exciter of claim 39, wherein said input signal modulating means further include filtering means to scale samples of the input signal based on the time interval to determine data transitions that are synchronous with changes in the logical state of the data input signal.

41. A method for using a digital input signal to modulate a radio frequency output signal for transmission, comprising the steps of:

(a) producing an edge detect signal when the digital input signal changes logical state, (b) sampling the digital input signal at a predefined sample rate;

(c) determining a time interval between when the digital input signal was last sampled at the predefined sample rate and the time at which the edge detect signal was produced;

(d) scaling samples of the digital input signal based on the time interval to determine data transitions that are synchronous with changes in the logical state of the digital input signal, (e) processing the data transitions to produce a digital complex signal having both in-phase and quadrature components;

(f) sampling the digital complex signal to produce sampled values;

(g) interpolating between the sampled values of the digital complex signal to determine interpolated values intermediate the sampled values, thereby increasing an effective sample rate at which the digital complex signal is sampled, sampled and interpolated values together comprising an interpolated signal;

(h) converting the interpolated signal from a complex signal to a pass band signal that is not complex; and (i) converting the pass band signal from a lower frequency signal to a higher frequency signal for output and transmission as a modulated radio signal.

42. An exciter for a radio transmitter comprising:

(a) digital signal processor means, coupled to receive an input signal, for modulating the input signal to produce a complex modulated signal according to a selected modulation scheme;

(b) delay means for delaying a signal that is being modulated by the digital signal processor means for a selected interval of time;

(c) means for selectively determining a mode in which the digital signal processor means operate, including an analog mode in which the input signal is an analog signal, and a data mode in which the input signal is a data signal; and (d) mode transition means for switching between the analog mode and the data mode, said mode transition means setting the input signal to zero during a switching between the analog mode and the data mode, said delay means delaying one of the data signal and the analog signal so as to equalize times required by the digital signal processor means to process the analog and the data signals, thereby ensuring that at most, an insignificant time shift in a modulated signal output from the exciter occurs when a change between the data and analog modes occurs.

43. In an exciter for a radio transmitter, a method for equalizing delays between modulation of an analog signal and modulation of a data signal, comprising the steps of:

(a) modulating an input signal to produce a complex modulated signal according to a selected modulation scheme;

(b) delaying a signal that is being modulated for a selected interval of time;

(c) selectively determining a mode in which the exciter operates, including an analog mode in which the input signal is an analog signal, and a data mode in which the input signal is a data signal;

(d) setting the input signal to zero during a switching between the analog mode and the data mode; and (e) delaying one of the data signal and the analog signals so as to equalize times required to modulate the analog and the data signals, thereby ensuing that at most, an insignificant time shift in a modulated signal output from the exciter occurs when the exciter changes between the data and analog modes.

* * * * *